(12) United States Patent
Kang et al.

(10) Patent No.: US 10,476,011 B2
(45) Date of Patent: Nov. 12, 2019

(54) DISPLAY DEVICE

(71) Applicant: LG ELECTRONICS INC., Seoul (KR)

(72) Inventors: Kitae Kang, Seoul (KR); Namhun Kim, Seoul (KR); Sangdon Park, Seoul (KR); Brian Chung, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/985,342

(22) Filed: May 21, 2018

(65) Prior Publication Data

US 2019/0237685 A1  Aug. 1, 2019

(30) Foreign Application Priority Data

Jan. 31, 2018 (KR) .......................... 10-2018-0012319

(51) Int. Cl.
| | | |
|---|---|---|
| *G02F 1/1333* | (2006.01) | |
| *G06F 1/16* | (2006.01) | |
| *H01L 51/00* | (2006.01) | |
| *H05K 1/18* | (2006.01) | |
| *H01L 51/50* | (2006.01) | |
| *F21V 8/00* | (2006.01) | |

(52) U.S. Cl.
CPC ........ *H01L 51/0097* (2013.01); *G02B 6/0016* (2013.01); *G02F 1/133308* (2013.01); *G06F 1/1652* (2013.01); *H01L 51/50* (2013.01); *H05K 1/189* (2013.01)

(58) Field of Classification Search
CPC ............. G06F 1/1652; G02F 1/133305; G02F 1/133308
See application file for complete search history.

(56) References Cited

U.S. PATENT DOCUMENTS

| | | | | |
|---|---|---|---|---|
| 9,081,540 B1* | 7/2015 | Cho | .................. | G06F 1/1601 |
| 9,123,290 B1* | 9/2015 | Cho | .................. | G06F 1/1652 |
| 9,182,620 B1* | 11/2015 | Yu | .................. | G06F 1/1601 |
| 9,304,539 B2* | 4/2016 | Song | .................. | G06F 1/1601 |
| 9,510,440 B2* | 11/2016 | Nam | .................. | H05K 1/028 |
| 9,541,779 B2* | 1/2017 | Jeong | .................. | H05K 1/028 |
| 9,763,346 B2* | 9/2017 | Li | .................. | H05K 5/0017 |

(Continued)

FOREIGN PATENT DOCUMENTS

| | | |
|---|---|---|
| KR | 1020150081669 | 7/2015 |
| KR | 1020150125141 | 11/2015 |
| KR | 1020170124681 | 11/2017 |

OTHER PUBLICATIONS

PCT International Application No. PCT/KR2014/005057, International Search Report dated Feb. 28, 2014, 2 pages.

*Primary Examiner* — Adrian S Wilson
(74) *Attorney, Agent, or Firm* — Lee, Hong, Degerman, Kang & Waimey PC

(57) ABSTRACT

A display device is disclosed. The display device may comprise: a flexible display panel; a flexible plate being positioned at a rear of the flexible display panel, the flexible plate being coupled to the flexible display panel; and a flexible jig being positioned on a rear surface of the flexible plate, the flexible jig including a plurality of segments, wherein at least one of the plurality of segments is fixed to the rear surface of the flexible plate, and wherein at least another of the plurality of segments is slidably coupled to the rear surface of the flexible plate.

20 Claims, 25 Drawing Sheets

(56) References Cited

U.S. PATENT DOCUMENTS

| | | | | |
|---|---|---|---|---|
| 9,826,654 B2* | 11/2017 | Fujii | .................. | H05K 7/14 |
| 9,980,399 B2* | 5/2018 | Cho | .................. | G09F 9/301 |
| 10,152,085 B2* | 12/2018 | Sun | .................. | G09F 9/301 |
| 10,229,618 B2* | 3/2019 | Chen | .................. | G09F 19/02 |
| 2011/0249425 A1* | 10/2011 | Aurongzeb | .................. | F21V 14/02 |
| | | | | 362/102 |
| 2012/0050639 A1* | 3/2012 | Kim | .................. | G02F 1/133308 |
| | | | | 349/58 |
| 2012/0281367 A1* | 11/2012 | He | .................. | H05K 5/02 |
| | | | | 361/728 |
| 2013/0155655 A1* | 6/2013 | Lee | .................. | H05K 5/03 |
| | | | | 362/97.1 |
| 2014/0003006 A1* | 1/2014 | Ahn | .................. | G06F 1/1652 |
| | | | | 361/749 |
| 2014/0118910 A1* | 5/2014 | Sung | .................. | G09F 9/301 |
| | | | | 361/679.01 |
| 2014/0140023 A1* | 5/2014 | Lee | .................. | H05K 5/03 |
| | | | | 361/755 |
| 2014/0198465 A1* | 7/2014 | Park | .................. | H05K 5/0226 |
| | | | | 361/749 |
| 2014/0226266 A1* | 8/2014 | Kang | .................. | H01L 51/0097 |
| | | | | 361/679.01 |
| 2014/0247544 A1* | 9/2014 | Ryu | .................. | G09F 11/18 |
| | | | | 361/679.01 |
| 2014/0247566 A1* | 9/2014 | Lee | .................. | H05K 5/03 |
| | | | | 361/749 |
| 2015/0009635 A1* | 1/2015 | Kang | .................. | G09F 9/301 |
| | | | | 361/749 |
| 2015/0043136 A1* | 2/2015 | Kim | .................. | G02F 1/133305 |
| | | | | 361/679.01 |
| 2015/0092361 A1* | 4/2015 | Cho | .................. | H02K 7/00 |
| | | | | 361/749 |
| 2015/0130775 A1* | 5/2015 | Kim | .................. | G06F 1/1652 |
| | | | | 345/205 |
| 2015/0296641 A1* | 10/2015 | Song | .................. | H05K 5/0217 |
| | | | | 361/679.01 |
| 2016/0021769 A1* | 1/2016 | Shin | .................. | F16M 11/00 |
| | | | | 361/679.01 |
| 2016/0088743 A1* | 3/2016 | Zhang | .................. | G06F 1/1601 |
| | | | | 361/679.01 |
| 2016/0192519 A1* | 6/2016 | Song | .................. | H05K 5/0217 |
| | | | | 361/679.01 |
| 2016/0218316 A1* | 7/2016 | Lee | .................. | H05K 5/03 |
| 2016/0224056 A1* | 8/2016 | Guo | .................. | G09F 9/33 |
| 2016/0295711 A1* | 10/2016 | Ryu | .................. | G09F 9/301 |
| 2016/0353587 A1* | 12/2016 | Shin | .................. | G06F 1/1601 |
| 2016/0353594 A1* | 12/2016 | Cho | .................. | F16M 11/08 |
| 2017/0013726 A1* | 1/2017 | Han | .................. | H05K 1/028 |
| 2017/0164080 A1* | 6/2017 | Chung | .................. | H04R 1/025 |
| 2017/0193863 A1* | 7/2017 | Cho | .................. | H05K 5/0217 |
| 2017/0205658 A1* | 7/2017 | Jung | .................. | H04N 5/64 |
| 2017/0285391 A1* | 10/2017 | Zhang | .................. | G02B 6/0045 |
| 2017/0347466 A1* | 11/2017 | Kang | .................. | G09F 9/301 |
| 2018/0226001 A1* | 8/2018 | Chen | .................. | G09F 19/02 |

\* cited by examiner

FIG. 2
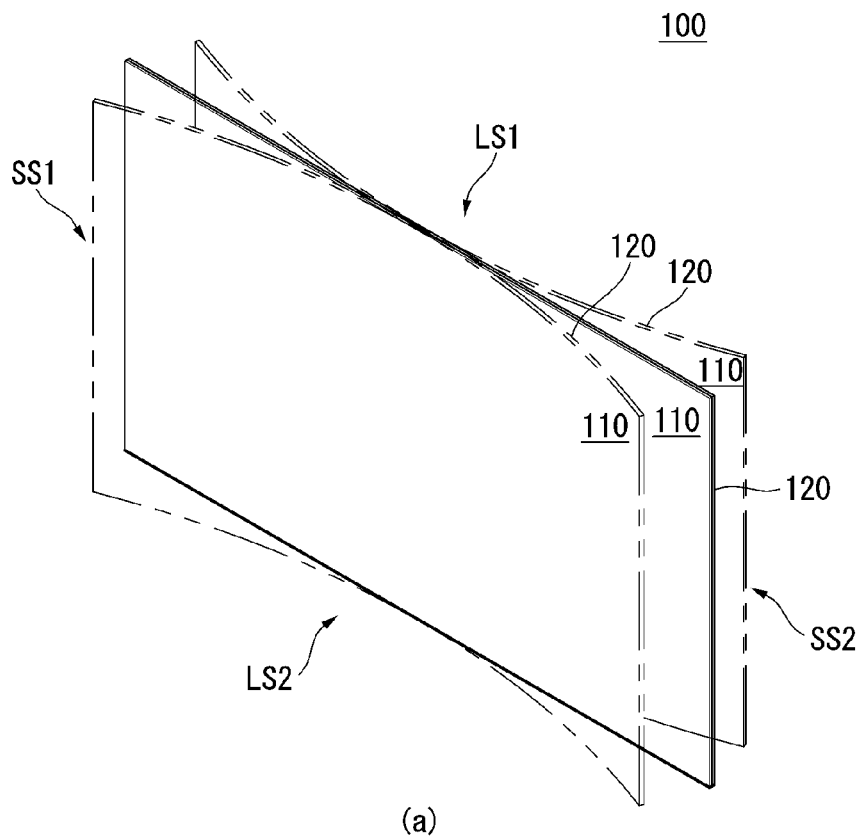
(a)
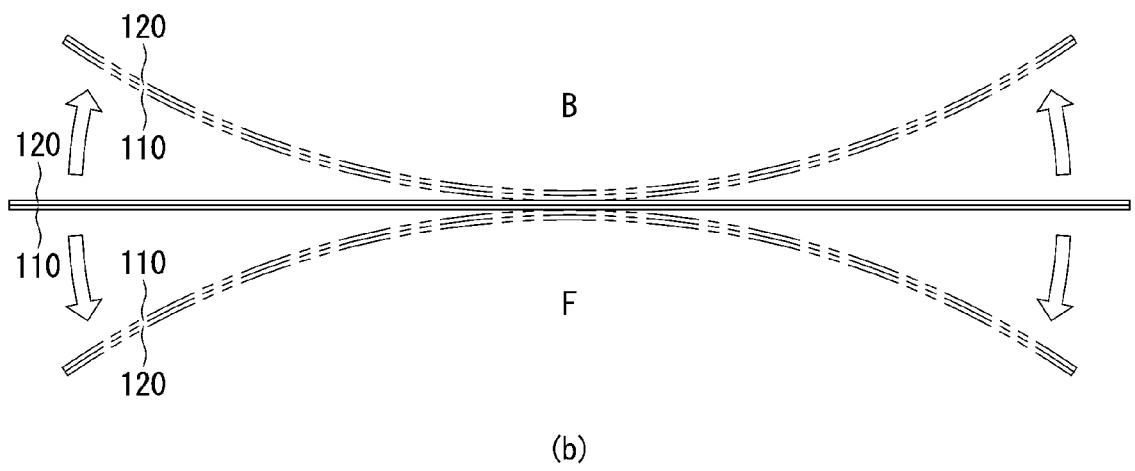
(b)

FIG. 13
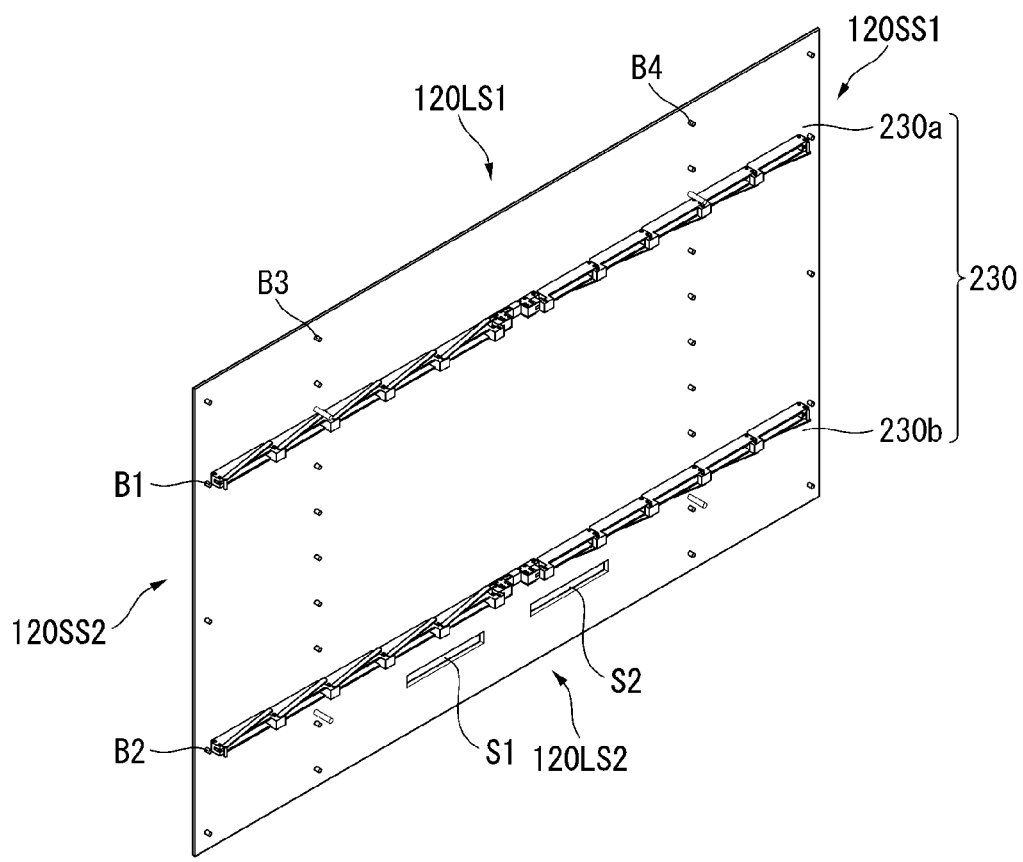
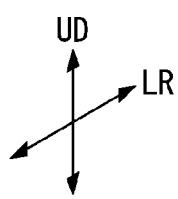

231 { 231L, 231R
231LH, 231RH
231LB, 231RB
LBH1, RBH1

DISPLAY DEVICE

Pursuant to 35 U.S.C. § 119(a), this application claims the benefit of earlier filing date and right of priority to Korean Patent Application No. 10-2018-0012319, filed on Jan. 31, 2018, the contents of which are hereby incorporated by reference herein in its entirety.

BACKGROUND OF THE INVENTION

Field of the Invention

The present invention relates to a display device. In particular, the present invention relates to a display device capable of changing the display concavely or convexly.

Discussion of the Related Art

With the development of the information society, various demands for display devices have been increasing. Various display devices, such as, e.g., liquid crystal displays (LCDs), plasma display panels (PDPs), electroluminescent displays (ELDs), and vacuum fluorescent displays (VFDs), have been studied and used to meet various demands for the display devices.

Among the display devices, OLED panels can display an image by depositing an organic layer capable of emitting light on a substrate having a transparent electrode formed thereon. OLED panels are not only thin but also flexible. Research has been conducted on the structural characteristics of a display device having such OLED panels.

SUMMARY OF THE INVENTION

Accordingly, an object of the present disclosure is to address the above-described and other problems.

Another object of the present invention is to provide a frame structure capable of changing the curvature of the display.

Another object of the present invention is to provide a joint structure capable of adjusting the curvature of the display.

According to an aspect of the present invention, there is provided a display device, comprising: a flexible display panel; a flexible plate being positioned at a rear of the flexible display panel, the flexible plate being coupled to the flexible display panel; and a flexible jig being positioned on a rear surface of the flexible plate, the flexible jig including a plurality of segments, wherein at least one of the plurality of segments is fixed to the rear surface of the flexible plate, and wherein at least another of the plurality of segments is slidably coupled to the rear surface of the flexible plate.

According to another aspect of the present invention, the flexible may jig include: a first flexible jig being positioned adjacent to a first side of the flexible plate, the first flexible jig being elongated alongside of the first side; and a second flexible jig being positioned adjacent to a second side of the flexible plate, the second flexible jig being elongated alongside of the second side, the second side may be opposite to the first side.

According to another aspect of the present invention, the first flexible jig may include: a first segment being positioned at a central portion of the flexible plate with reference to a longitudinal direction of the first segment; a second segment being positioned adjacent to an end of the flexible plate; a third segment being positioned between the first and second segments; and a fourth segment being positioned between the first and third segments or between the second and third segments.

According to another aspect of the present invention, the first segment may be fixed to the flexible plate, and the second to fourth segments may be slidably coupled to the flexible plate.

According to another aspect of the present invention, each of the first to fourth segments may include: an upper board being elongated along the longitudinal direction of the first segment; a lower board facing the upper board; and a middle board being disposed between the upper and lower boards, the middle board may form at least one inner hole.

According to another aspect of the present invention, the flexible plate may include a plurality of bosses being positioned at the rear surface of the flexible plate, the plurality of bosses may include: a first boss being positioned between the first segment and a third side of the flexible plate; and a second boss being positioned between the first segment and a fourth side of the flexible plate, wherein the first boss may be inserted into a first inner hole among the inner holes of the first flexible jig, the second boss may be inserted into a second inner hole among the inner holes of the first flexible jig, the third side may connect the first side to the second side, the fourth side may connect the first side to the second side, and the fourth side may be positioned opposite to the third side.

According to another aspect of the present invention, the inner hole may be elongated along the longitudinal direction of the first flexible jig.

According to another aspect of the present invention, when the first flexible jig becomes concave toward a forward of the display panel, then the first boss can move toward the third side with respect to the first inner hole, and then the second boss can move toward the fourth side with respect to the second inner hole.

According to another aspect of the present invention, when the first flexible jig becomes convex toward a forward of the display panel, then the first boss can move toward the fourth side with respect to the first inner hole, and then the second boss can move toward the third side with respect to the second inner hole.

According to another aspect of the present invention, a width of the fourth segment may be less than a width of the third segment.

According to another aspect of the present invention, the display device may further comprise a control gadget being positioned at the rear surface of the flexible plate, the flexible jig may include: an eleventh flexible jig being positioned between the control gadget and the third side of the plate; and a twelfth flexible jig being positioned between the control gadget and the fourth side of the plate, and the fourth side may be positioned opposite to the third side.

According to another aspect of the present invention, each of the eleventh flexible jig and twelfth flexible jig may include: a first segment, a side of the first segment being hinged to a side of the control gadget; a second segment, a side of the second segment being hinged to another side of the first segment; a third segment, a side of the third segment being hinged to another side of the second segment; a first link coupling the side of the control gadget with the side of the second segment; and a second link coupling the other side of the first segment with the side of the third segment.

According to another aspect of the present invention, the control gadget may be fixed to the flexible plate, and the eleventh flexible jig and the twelfth jig may be slidably coupled to the flexible plate.

According to another aspect of the present invention, each of the first to third segments may include: an inner groove being opened toward upward and downward; a bottom board being positioned in the inner groove; and a bottom hole being formed at the bottom board.

According to another aspect of the present invention, the flexible plate may include a plurality of bosses being positioned on the rear surface of the flexible plate, the plurality of bosses may include: a first boss being positioned between the control gadget and a third side of the flexible plate; and a second boss being positioned between the control gadget and a fourth side of the flexible plate, the first boss may be inserted into a first bottom hole among the bottom holes, and the second boss may be inserted into a second bottom hole among the bottom holes.

According to another aspect of the present invention, the bottom hole may be elongated along a longitudinal direction of the flexible jig.

According to another aspect of the present invention, when the eleventh flexible jig and the twelfth jig become concave toward a forward of the display panel, then the first boss can move toward the third side with respect to the first bottom hole, and then the second boss can move toward the fourth side with respect to the second bottom hole.

According to another aspect of the present invention, when the eleventh flexible jig and the twelfth jig become convex toward a forward of the display panel, then the first boss can move toward the fourth side with respect to the first bottom hole, and then the second boss can move toward the third side with respect to the second bottom hole.

According to another aspect of the present invention, the display device may further comprise: a central adhesive member being fixed to a front surface of the flexible plate, the central adhesive member being elongated in up-down direction at a central region of the flexible plate; and a coupling member being fixed to the front surface of the flexible plate at both side of the flexible plate, and a rear surface of the flexible display may be fixed to the central adhesive member and is in contact with the coupling member.

According to another aspect of the present invention, the coupling member may be a magnet.

According to at least one of embodiments of the present invention, a frame structure capable of changing the curvature of the display can be provided.

According to at least one of embodiments of the present invention, a joint structure capable of adjusting the curvature of the display can be provided.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 1 and 2 are views illustrating a display device having varying curvature according to an embodiment of the present invention.

FIG. 13 is a view showing a coupling of the plate with the flexible jig according to another embodiment of the present invention.

DETAILED DESCRIPTION OF THE EMBODIMENTS

Figure 1:
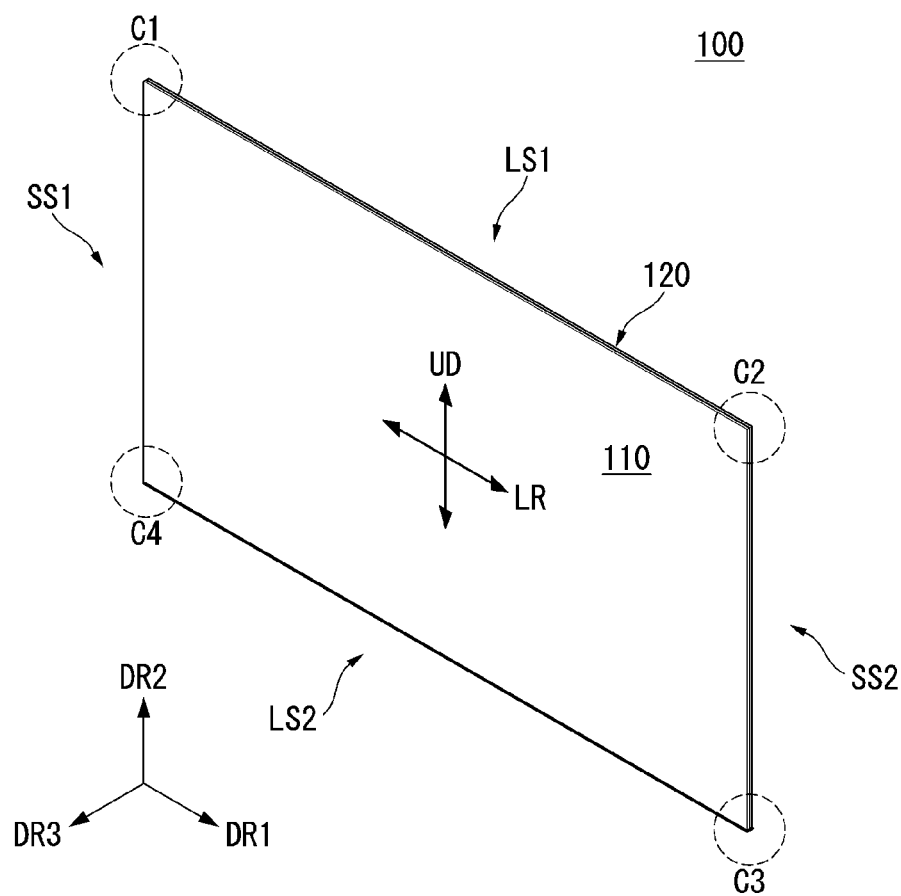

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, OLED (Organic Light Emitting Diode) panel will be described as an example of the display panel, but the display panel applicable to the present invention may not be limited to the OLED panel.

The display device 100 may include a first long side LS1 and a second long side LS2 opposite to the first long side LS1. The display device 100 may include a first short side SS1 and a second short side SS2 opposite to the first short side SS1. The first short side SS1 may be adjacent to both the first long side LS1 and the second long side LS2.

An area adjacent to the first short side SS1 may be referred to as a first short side area SS1. An area adjacent to the second short side SS2 may be referred to as a second short side area SS2. An area adjacent to the first long side LS1 may be referred to as a first long side area LS1. An area adjacent to the second long side LS2 may be referred to as a second long side area LS2. The first short side area SS1 may be referred to as a first side area. The second short side area SS2 may be referred to as a second side area. The first long side area LS1 may be referred to as a third side area. The second long side area LS2 may be referred to as a fourth side area.

The lengths of the first and second long sides LS1 and LS2 may be longer than the lengths of the first and second short sides SS1 and SS2 for the convenience of explanation. It is also possible that the lengths of the first and second long sides LS1 and LS2 are substantially equal to the lengths of the first and second short sides SS1 and SS2.

The display device 100 may include a display panel 110 for displaying an image. The display panel 110 may form a front surface of the display device 100. The display panel 110 can display an image toward the front of the display device 100. The first direction DR1 may be a direction along to the long sides LS1 and LS2 of the display device 100. The second direction DR2 may be a direction along to the short sides SS1 and SS2 of the display device 100. The third direction DR3 may be a direction normal to the first direction DR1 and/or the second direction DR2.

The first direction DR1 and the second direction DR2 may collectively be referred to as a horizontal direction. In addition, the third direction DR3 may be referred to as a vertical direction.

A side on which the display device 100 displays the image may be referred to as a 'forward direction' or a 'front side' of the display device 100. A side on which the image cannot be viewed may be referred to as a 'rearward direction' or a 'rear side' of the display device 100. From the viewpoint of the front side of the display device 100, the first long side LS1 may be referred to as an upper side or an upper surface, the second long side LS2 side may be referred to as a lower side or a lower surface, the first short side SS1 may be referred to as a left side or the left surface, and the second short side SS2 may be referred to as a right side or a right surface.

The first long side LS1, the second long side LS2, the first short side SS1 and the second short side SS2 may be referred to as an edge of the display device 100. The area where the first long side LS1, the second long side LS2, the first short side SS1, and the second short side SS2 meet with each other may be referred to as a corner. For example, the area where the first long side LS1 and the first short side SS1 meet may be referred to as a first corner C1. The area where the first long side LS1 and the second short side SS2 meet may be referred to as a second corner C2. The area where the second short side SS2 and the second long side LS2 meet may be referred to as a third corner C3. The area where the second long side LS2 and the first short side SS1 meet may be referred to as a fourth corner C4.

The direction from the first short side SS1 to the second short side SS2 or the direction from the second short side SS2 to the first short side SS1 may be referred to as the left and right direction LR. The direction from the first long side LS1 to the second long side LS2 or the direction from the second long side LS2 to the first long side LS1 may be referred to as the up and down direction UD.

Referring to FIG. 1, the display device 100 can include a display panel 110 and a plate 120. The plate 120 can be a metal plate. The plate 120 can be flexible. The plate 120 can be referred to as a flexible plate. The plate 120 can be referred to as a frame.

The display panel 110 may be positioned at a front of the plate 120. The display panel 110 may be positioned on a front surface of the plate 120. The display panel 110 may be flexible. For example, the display panel 110 may be an OLED panel.

The display panel 110 is provided on the front surface of the display device 100. An image can be displayed on a front surface of the display panel 110. The display panel 110 divides the image into a plurality of pixels, and outputs an image by adjusting the color, brightness, and saturation of each pixel. The display panel 110 may be divided into an active area in which an image is displayed and a de-active area in which no image is displayed. The display panel 110 may generate light corresponding to red, green, or blue colors according to a control signal.

Referring to FIG. 2, the display device 100 may have a variable curvature. The display device 100 may be bent forward (F) or rearward (B) of the display device 100. The display device 100 may be convex or concave toward forward (F) of the display device 100.

The plate 120 can be bent at the same curvature as the display panel 110. The display panel 110 can be bent in correspondence with the shape of the plate 120.

Figure 3:
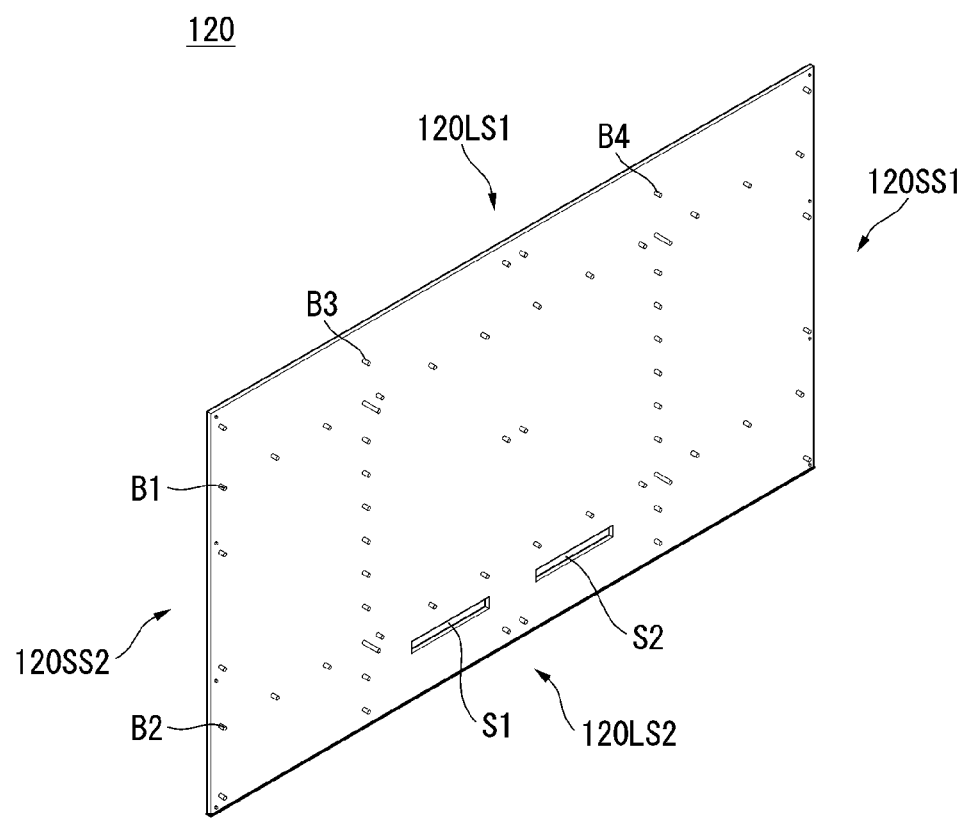
FIG. 3 is a view showing a plate according an embodiment of the present invention.

Referring to FIG. 3, the plate 120 may include bosses B1 to B4. A plurality of bosses B1, B2, B3, and B4 may be formed on the rear surface of the plate 120. The plurality of bosses B1, B2, B3, and B4 may be arranged in the left-right direction or the up-down direction of the plate 120.

For example, a first plurality of bosses B1 may be positioned adjacent to the first long side 120LS1 of the plate 120. The first long side 120LS1 of the plate 120 may be referred to as the first side LS1 of the plate 120. The first plurality of bosses B1 may be arranged adjacent to the first long side 120LS1 of the plate 120 and along the first long side 120LS1 of the plate 120 (i.e., in the left-right direction LR). The first plurality of bosses B1 may be referred to as a first group of bosses B1 or a first boss group B1. The first boss group B1 may be elongated alongside of the first side LS1 of the plate 120.

For example, a second plurality of bosses B2 may be positioned adjacent to the second long side 120LS2 of the plate 120. The second long side 120LS2 of the plate 120 may be referred to as the second side LS2 of the plate 120. The second plurality of bosses B2 may be arranged adjacent to the second long side 120LS2 of the plate 120 and along the second long side 120LS2 of the plate 120 (i.e., in the left-right direction LR). The second plurality of bosses B2 may be referred to as a second group of bosses B2 or a second boss group B2. The second boss group B2 may be elongated alongside of the second side LS2 of the plate 120.

For example, a third plurality of bosses B3 may be positioned adjacent to the second short side 120SS2 of the plate 120. The second short side 120SS2 of the plate 120 may be referred to as the third side LS3 of the plate 120. The third plurality of bosses B3 may be arranged adjacent to the second short side 120SS2 of the plate 120 and along the second short side 120SS2 of the plate 120 (i.e., in the up-down direction UD). The third plurality of bosses B3 may be referred to as a third group of bosses B3 or a third boss group B3. The third boss group B3 may be elongated alongside of the third side LS3 of the plate 120.

For example, a fourth plurality of bosses B4 may be positioned adjacent to the first short side 120SS1 of the plate 120. The first short side 120SS1 of the plate 120 may be referred to as the fourth side LS4 of the plate 120. The fourth plurality of bosses B4 may be arranged adjacent to the first short side 120SS1 of the plate 120 and along the first short side 120SS1 of the plate 120 (i.e., in the up-down direction UD). The fourth plurality of bosses B4 may be referred to as a fourth group of bosses B4 or a fourth boss group B4. The fourth boss group B4 may be elongated alongside of the fourth side LS4 of the plate 120.

The slots S1 and S2 may be formed on the plate 120. The slots S1 and S2 may pass through the plate 120. The slots S1 and S2 may be located at the lower center of the plate 120. The slots S1 and S2 may be positioned adjacent to a center of the second side 120LS2 of the plate 120. The slots S1 and S2 may be elongated alongside of the second long side 120LS2. The slots S1 and S2 may have a plurality of slots S1 and S2. The plurality of slots S1 and S2 may include a first slot S1 and a second slot S2. The first slot S1 may be located adjacent to the second long side 120LS2 of the plate 120. The second slot S2 may be located adjacent to the second long side 120LS2 of the plate 120. The first slot S1 and the second slot S2 may be disposed along the second long side 120LS2.

Figure 4:
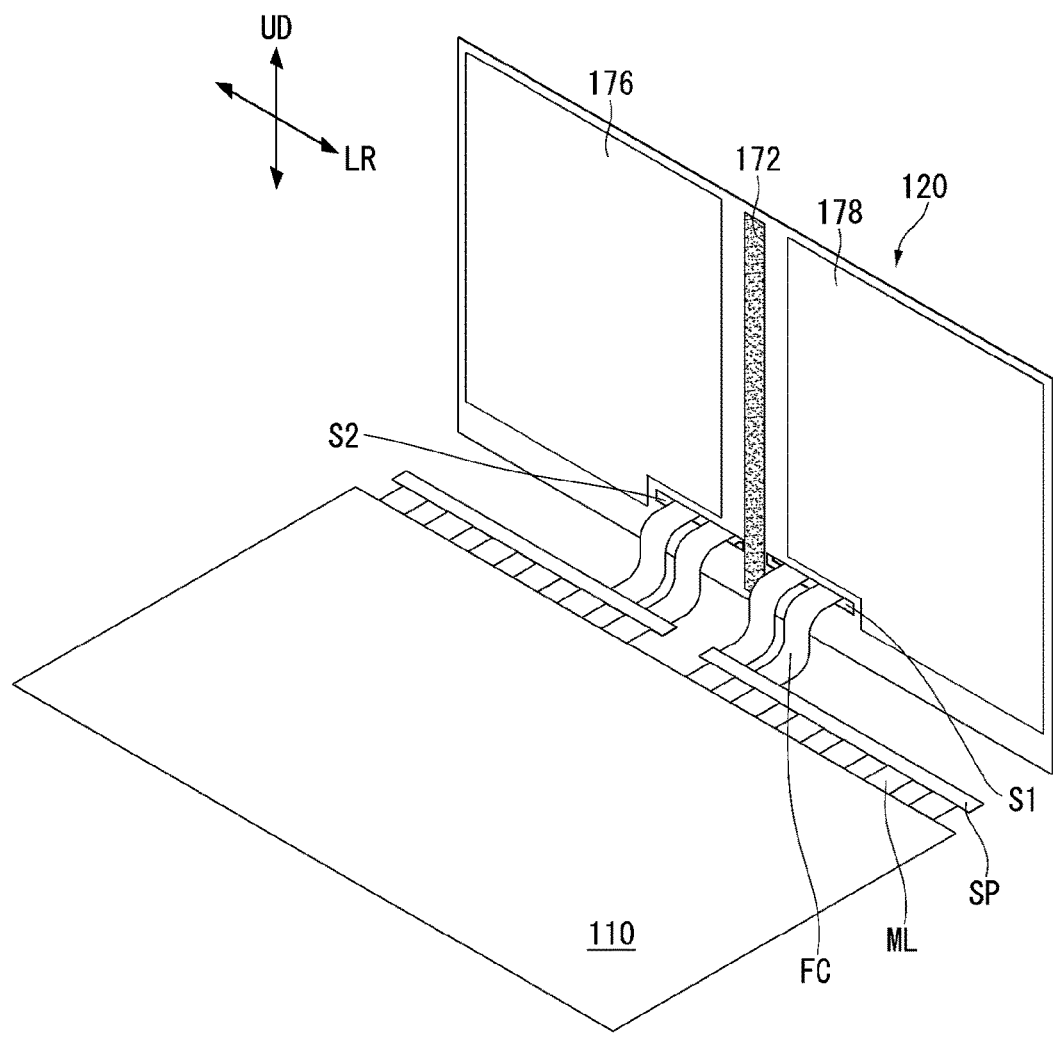
FIG. 4 is a view illustrating a coupling of display panel according an embodiment of the present invention.

Referring to FIG. 4, the central adhesive member 172 may be positioned on the front surface of the plate 120. The central adhesive member 172 can be fixed to the central region of the plate 120. The central adhesive member 172 may be elongated in the up-down direction UD. For example, the central adhesive member 172 may be a double-sided tape.

The coupling members 176 and 178 may be positioned on the front surface of the plate 120. The coupling members 176 and 178 can be formed on the front surface of the plate 120. The coupling members 176 and 178 can be formed integrally with the plate 120. The first coupling member 176 may form a magnetic field. The second coupling member 178 may be located opposite the first coupling member 176 with respect to the central adhesive member 172. The central adhesive member 172 may be positioned between the first coupling member 176 and the second coupling member 178. The second coupling member 178 may form a magnetic field. The coupling members 176 and 178 may form a kind of magnetic flux. The coupling members 176 and 178 may contain magnetic materials. For example, the coupling members 176, 178 may be magnets.

The member layer ML may extend from the display panel 110 and be electrically connected to the display panel 110. The member layer ML may be, for example, a COF (chip-on-film), a COG (chip-on-glass), a FPCB (flexible printed circuit board), a TCP (tape carrier package).

The PCB SP may be electrically connected to the member layer ML. The PCB SP may be a printed circuit board. The PCB SP can integrate a plurality of member layers ML. The cable FC (for example FFC) can be electrically connected to the PCB SP. The cable FC may be electrically connected to the control units located behind the plate 120. The cable FC can be inserted into the slots S1, S2.

The display panel 110 may be positioned in front of the plate 120. The display panel 110 may be fixed to or coupled to the front surface of the plate 120 by the adhesive member 172 and/or the coupling members 176 and 178.

The central area of the display panel 110 may be adhered to the central adhesive member 172. The display panel 110 may be coupled to the front surface of the plate 120 by coupling members 176 and 178. The display panel 110 may be magnetically coupled to the front surface of the plate 120. A portion of the display panel 110 can slightly slide on the plate 120. The portion of the display panel 110 can be between the central area of the display panel 110 and the short side 120SS1 and 120SS2 of the plate 120. The display panel 110 may be formed in accordance with the shape of the plate 120 while being coupled to the front surface of the plate 120.

Figure 5:
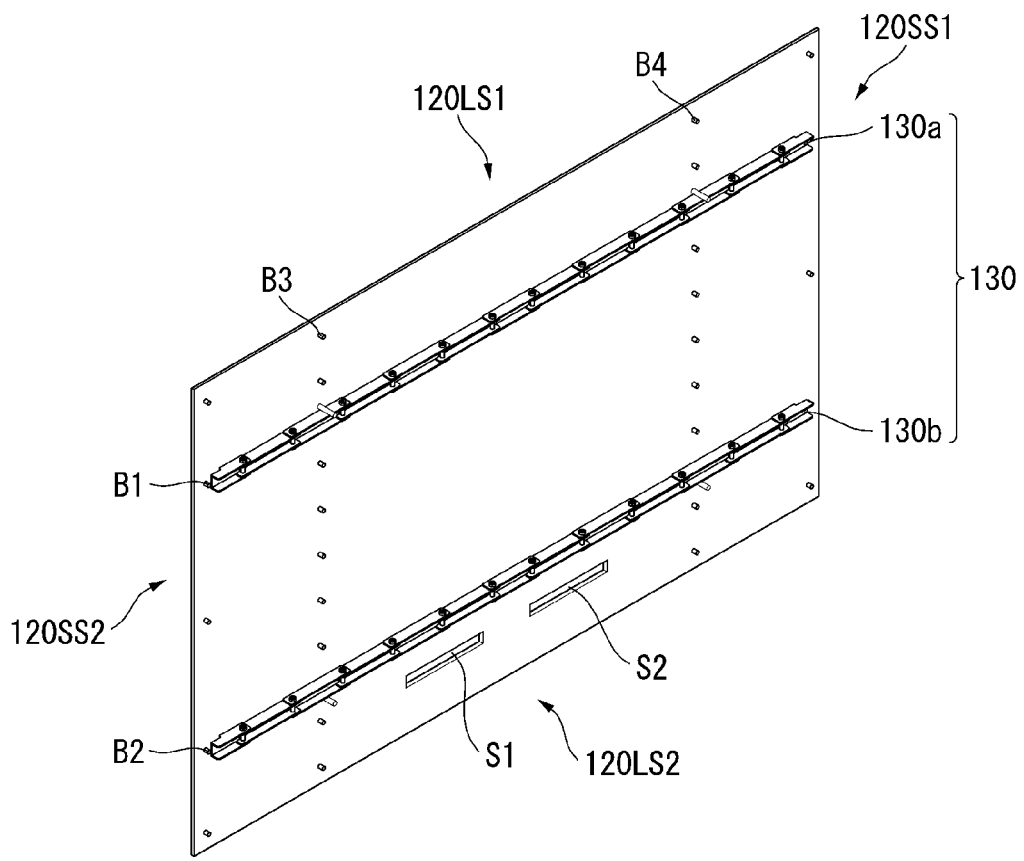
FIGS. 5 and 6 are views showing a coupling of a plate and a flexible jig according an embodiment of the present invention.
Figure 6:
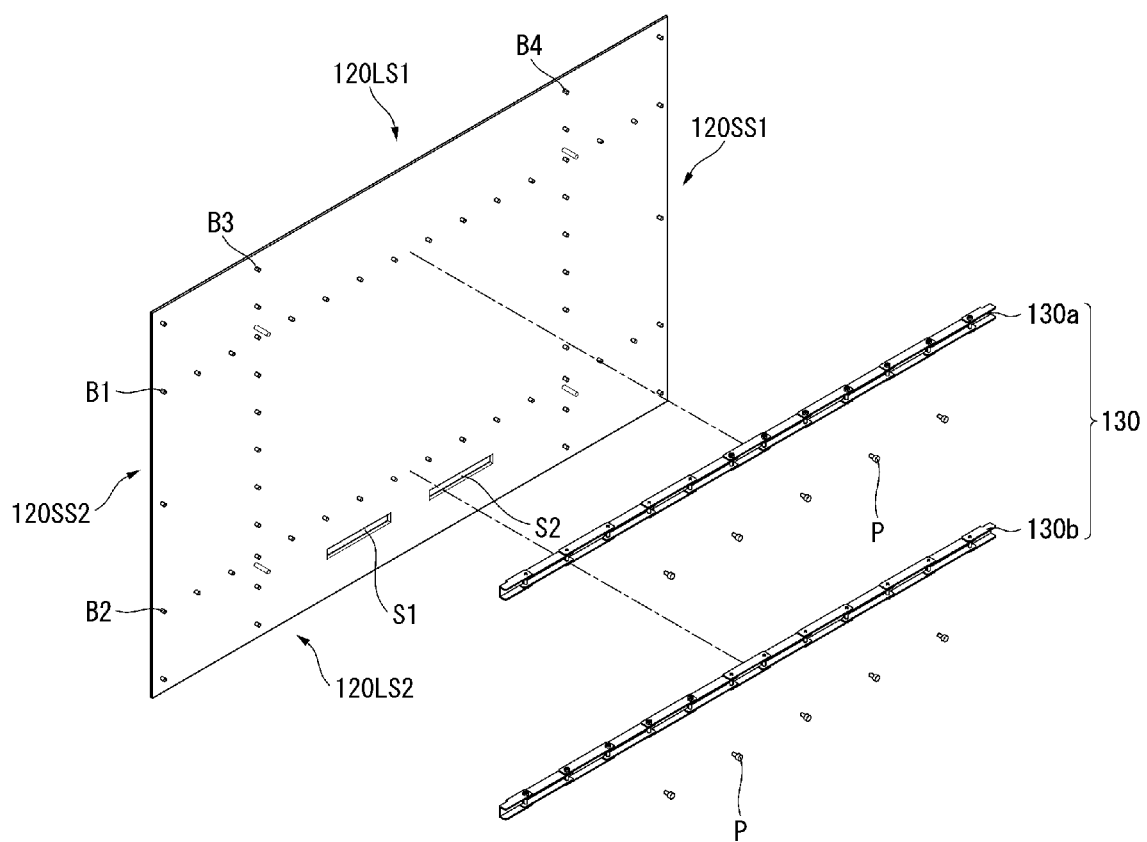

Referring to FIGS. 5 and 6, a flexible jig 130 may be positioned on the rear surface of the plate 120. When the first and second plurality of bosses B1 and B2 are inserted into the flexible jig 130, the flexible jig 130 can be coupled to the rear surface of the plate 120. The flexible jig 130 may be referred to as a flexible bar.

The flexible jig 130 may be provided in plural. The plurality of flexible jigs 130*a* and 130*b* may be spaced apart from each other in the up-down direction UD of the plate 120. Each of the plurality of flexible jigs 130*a* and 130*b* can be elongated in the left-right direction LR of the plate 120.

For example, the first flexible jig 130*a* may be positioned adjacent to the first long side 120LS1 of the plate 120. The first plurality of bosses B1 may be inserted into the first flexible jig 130*a*. The plurality of fastening members P can be fastened to the first plurality of bosses B1. The first flexible jig 130*a* can be coupled to or fastened to the plate 120.

The second flexible jig 130*b* may be positioned adjacent to the second long side 120LS2 of the plate 120. The second plurality of bosses B2 may be inserted into the second flexible jig 130*b*. The plurality of fastening members P can be fastened to the second plurality of bosses B2. The second flexible jig 130*b* can be coupled or fastened to the plate 120.

The fastening member P may be one among a piece, a screw, or a bolt.

Figure 7:
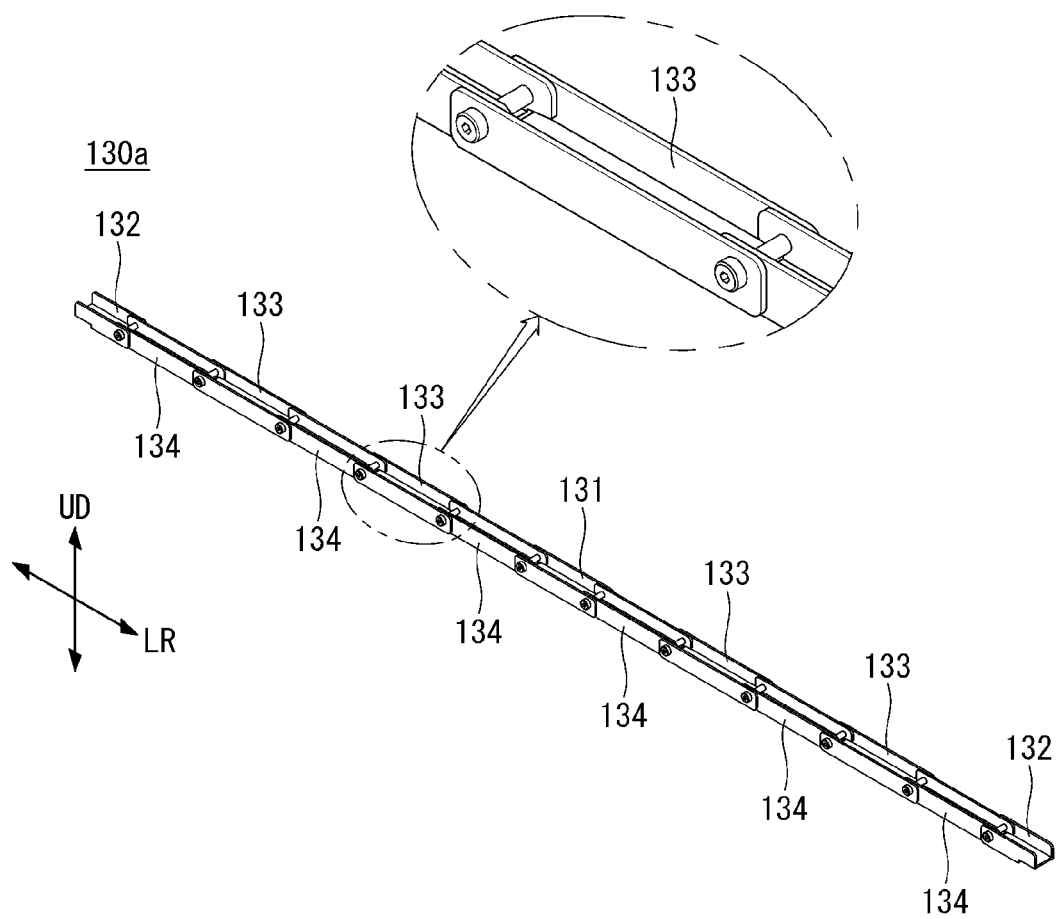
FIGS. 7 and 8 are views showing the flexible jig according an embodiment of the present invention.

Referring to FIG. 7, the first flexible jig 130*a* may include a plurality of segments 131, 132, 133, and 134. The plurality of segments 131, 132, 133, and 134 may be coupled by a plurality of pins P or a plurality of fastening members P. The plurality of segments 131, 132, 133, and 134 may be referred to as a plurality of rigid bars.

For example, the first flexible jig 130*a* may include a first segment 131 to a fourth segment 134. The first segment 131 may be disposed at the center of the first flexible jig 130*a*. A plurality of second segments 132 may be disposed on both sides or both ends of the first flexible jig 130*a*. A plurality of third segments 133 may be disposed between the first segment 131 and the second segment 132. A plurality of fourth segments 134 may be disposed between the first segment 131, the second segment 132, and the third segment 133.

For example, a fourth segment 134, a third segment 133, a fourth segment 134, a third segment 134, the third segment 133, the fourth segment 134, and the second segment 132 may be sequentially arranged at a side of the first segment 131. The fourth segment 134, the third segment 133, the fourth segment 134, the third segment 133, the fourth segment 134 and the second segment 132 may be sequentially arranged at another side of the first segment 131.

The second flexible jig 130b may have a plurality of segments. The plurality of segments may be coupled by a plurality of pins. The second flexible jig 130b is configured in the same way as the first flexible jig 130a, so a detailed description of the second flexible jig 130b will be omitted.

Figure 8:
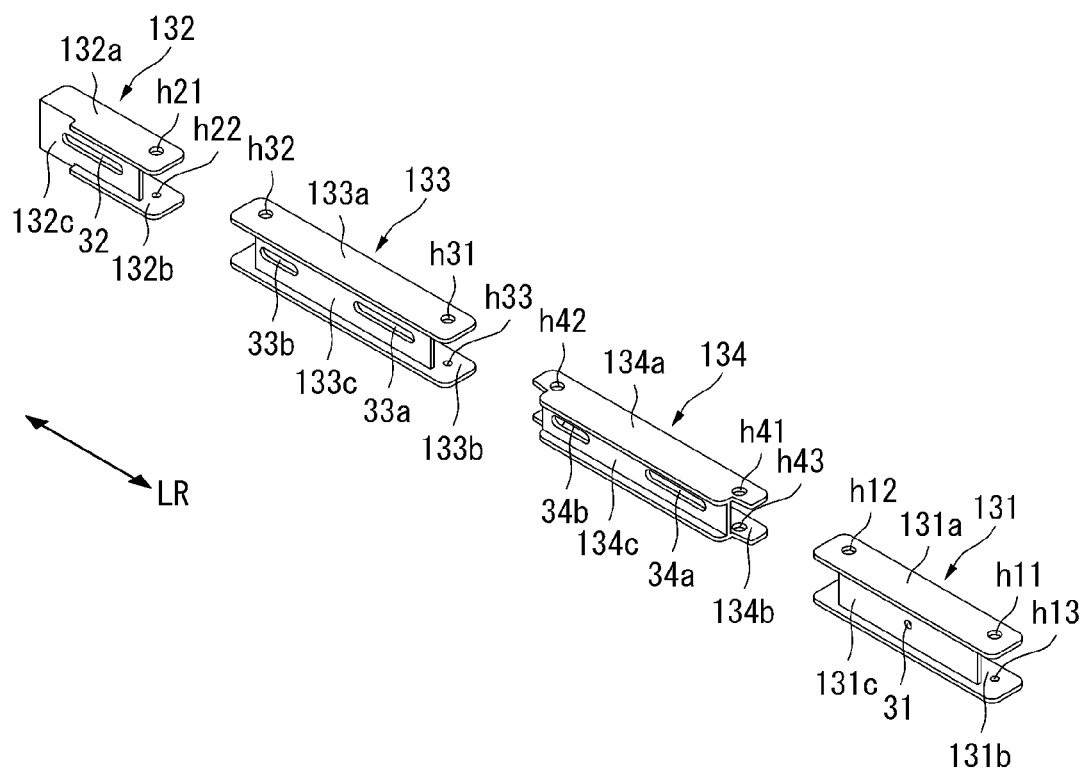

Referring to FIG. 8, the first flexible jig 130a may include a first segment 131 to a fourth segment 134.

The first segment 131 may include a first upper board 131a and a first lower board 131b. The first lower board 131b can be spaced apart from the first upper board 131a. The first segment 131 may include a first middle board 131c disposed between the first upper board 131a and the first lower board 131b.

The first upper board 131a may have a plurality of upper holes h11 and h12. The plurality of upper holes h11 and h12 may be disposed on a side of the first upper board 131a and on the other side of the first upper board 131a. The plurality of upper holes h11 and h12 may be formed through the first upper board 131a.

The first lower board 131b may have a plurality of lower holes h13. The plurality of lower holes h13 may be disposed on a side and the other side of the first lower board 131b, respectively. The plurality of lower holes h13 may be formed through the first lower board 131b.

The first middle board 131c may be positioned between a first upper board 131a and a first lower board 131b. The first middle board 131c may be positioned between the upper hole h11 disposed on the side of the first upper board 131a and the upper hole h12 disposed on the other side of the first upper board 131a. The first middle board 131c may be positioned between the lower hole h13 disposed on a side of the first lower board 131b and the lower hole disposed on the other side of the first lower board 131b.

The first middle board 131c may have an inner hole 31. The inner hole 31 may be formed at the center of the first middle board 131c. The inner hole 31 may be formed through the first middle board 131c.

The first segment 131 may have a first width. The first width can be defined as a distance between the first upper board 131a and the first lower board 131b. The first width can be defined as the width of the first middle board 131c.

The second segment 132 can includes a second upper board 132a, a second lower board 132b, a second middle board 132c. The second lower board 132b can be spaced apart from the second upper board 132a. The second middle board 132c can be disposed between the second upper board 132a and the second lower board 132b.

The second upper board 132a may have a upper hole h21. The upper hole h21 may be disposed on a side of the second upper board 132a. The upper hole h21 may pass through the second upper board 132a.

The second lower board 132b may have a lower hole h22. The lower hole h22 may be disposed on a side of the second lower board 132b. The lower hole h22 may pass through the second lower board 132b.

The second middle board 132c may be located adjacent to the center between the second upper board 132a and the second lower board 132b.

The second middle board 132c may have an inner hole 32. The inner hole 32 can be disposed at the center of the second middle board 132c in a front-back direction. The inner hole 32 can be elongated in the longitudinal direction (e.g., the left-right direction LR). The inner hole 32 may pass through the second middle board 132c.

The second segment 132 may have a second width. The second width may be a distance between the second upper board 132a and the second lower board 132b. The second width may be a width of the second middle board 132c. The second width may be substantially the same as the first width.

The third segment 133 may include a third upper board 133a, a third lower board 133b and a third middle board 133c. The third lower board 133b may be spaced apart from the third upper board 133a. The third middle board 133c may be disposed between the third upper board 133a and the third lower board 133b.

The third upper board 133a may have a plurality of upper holes h31 and h32. The plurality of upper holes h31 and h32 may be disposed on a side of the third upper board 133a and on the other side of the upper board 133a. The plurality of upper holes h31 and h32 may pass through the third upper board 133a.

The third lower board 133b may have a plurality of lower holes h33. The plurality of lower holes h33 may be disposed on a side of the third lower board 133b and on the other side of the third lower board 133b. The plurality of lower holes h33 may pass through the third lower board 133b.

The third middle board 133c may be positioned between the third upper board 133a and the third lower board 133b. The third middle board 133c may be disposed between the upper hole h31 located on the side of the third upper board 133a and the upper hole h32 located on the other side of the third upper board 133a. The third middle board 133c may be disposed between the lower hole h33 located on the side of the third lower board 133b and the lower hole (not shown) located on the other side of the third lower board 133b.

The third middle board 133c may have a plurality of inner holes 33a and 33b. The plurality of inner holes 33a and 33b may be located on a side of the third middle board 133c and on the other side of the third middle board 133c. The plurality of inner holes 33a and 33b may be elongated in the longitudinal direction (e.g., the left-right direction LR). The plurality of inner holes 33a and 33b may be arranged in series along the third middle board 133c. The plurality of inner holes 33a and 33b may be arranged sequentially along the longitudinal direction (that is, the left-right direction LR). The plurality of inner holes 33a and 33b may pass through the third middle board 133c.

The third segment 133 may have a third width. The third width may be a distance between the third upper board 133a and the third lower board 133b. The third width may be a width of the third middle board 133c. The third width may be substantially the same as the first width or the second width.

The fourth segment 134 may include a fourth upper board 134a, a fourth lower board 134b, and a fourth middle board 134c. The fourth lower board 134b may be spaced apart from the fourth upper board 134a. A fourth middle board 134c may be disposed between the fourth upper board 134a and the fourth lower board 134b.

The fourth upper board 134a may have a plurality of upper holes h41 and h42. The plurality of upper holes h41 and h42 may be formed on a side of the fourth upper board 134a and on the other side of the fourth upper board 134a. The plurality of upper holes h41 and h42 may pass through the fourth upper board 134a. The length of the front portion of the fourth upper board 134a may be greater than the length of the rear portion of the fourth upper board 134a. The length of the fourth upper board 134a can be with reference to a longitudinal direction of the upper board 134a. The fourth upper board 134a may have a different thickness depending on the position, with reference to the front-back direction. For example, the thickness of the fourth upper board 134a at the center of the fourth upper board 134a may be greater than the thickness of the fourth upper board 134a at both ends of the fourth upper board 134a.

The fourth lower board 134b may have a plurality of lower holes h43 and h44. The plurality of lower holes h43 and h44 may be formed on a side of the fourth lower board 134b and on the other side of the fourth lower board 134b. The plurality of lower holes h43 and h44 may pass through the fourth lower board 134b. The length of the front portion of the fourth lower board 134b may be greater than the length of the rear portion of the fourth lower board 134b. The length of the fourth lower board 134b can be with reference to a longitudinal direction of the lower board 134b. The fourth lower board 134b may have a different thickness depending on the position, with reference to the front-back direction. For example, the thickness of the fourth lower board 134b at the center of the fourth lower board 134b may be greater than the thickness of the fourth lower board 134b at both ends of the fourth lower board 134b.

The fourth middle board 134c may have a plurality of inner holes 34a and 34b. The plurality of inner holes 34a and 34b may be located on a side of the fourth middle board 134c and on the other side of the fourth middle board 134c. The plurality of inner holes 34a and 34b may be elongated in the longitudinal direction (e.g., the left-right direction LR). The plurality of inner holes 34a and 34b may be arranged in series along the fourth middle board 134c. The plurality of inner holes 34a and 34b may be arranged sequentially along the longitudinal direction (that is, the left-right direction LR). The plurality of inner holes 34a and 34b may pass through the fourth middle board 134c.

The fourth segment 134 may have a fourth width. The fourth width may be a distance between the fourth upper board 134a and the fourth lower board 134b. The fourth width may be a width of the fourth middle board 134c. The fourth width may be in accordance with the first to third width. The fourth width may be smaller than the first to third width.

Figure 9:
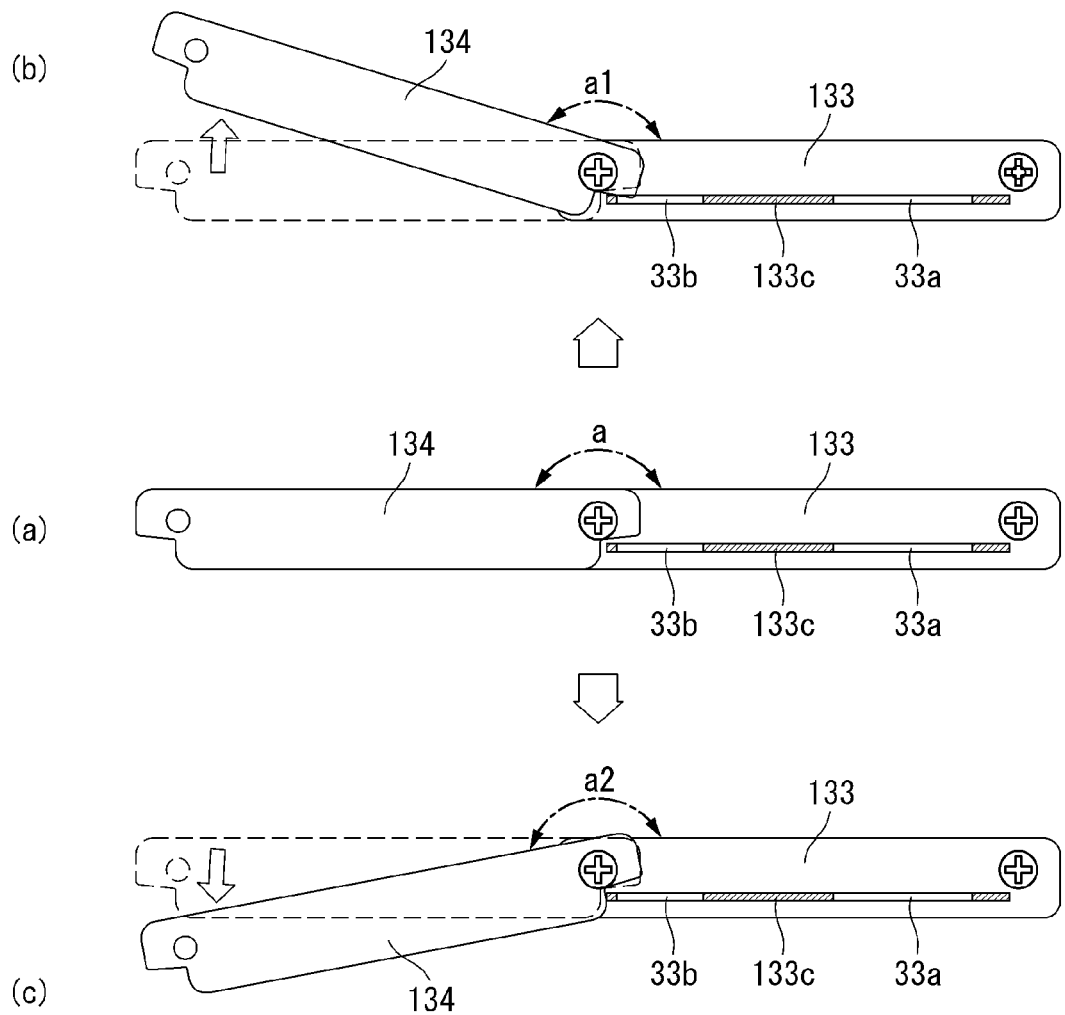
FIG. 9 is a view illustrating the flexible jig according an embodiment of the present invention.

Referring to FIG. 9, the first flexible jig 130a (see FIG. 7) may be bent or curved. For example, the fourth segment 134 may be bent or curved at a certain angle with respect to the neighboring third segment 133. The fourth segment 134 may be bent or curved at a certain angle with respect to the neighboring first segment 131 or the second segment 132.

Referring to FIG. 9 (a), a side of the fourth segment 134 may face the third middle board 133c without contacting the third middle board 133c. The fourth segment 134 may not be bent or curved with respect to the third segment 133. For example, the angle a between the fourth segment 134 and the third segment 133 may be 180 degrees. The angle a between the fourth segment 134 and the third segment 133 may be an angle between the front surface of the fourth segment 134 and the front surface of the third segment 133.

Referring to FIG. 9 (b), a side of the fourth segment 134 may contact the third middle board 133c of the third segment 133 or may be inserted into the inner hole 33b of the third middle board 133c. The fourth segment 134 may be bent or curved with respect to the third segment 133. For example, the angle a1 between the fourth segment 134 and the third segment 133 may be less than 180 degrees.

Referring to FIG. 9 (c), a side of the fourth segment 134 may contact the third middle board 133c of the third segment 133. The fourth segment 134 may be bent or curved with respect to the third segment 133. For example, the angle a2 between the fourth segment 134 and the third segment 133 may be greater than 180 degrees.

Figure 10:
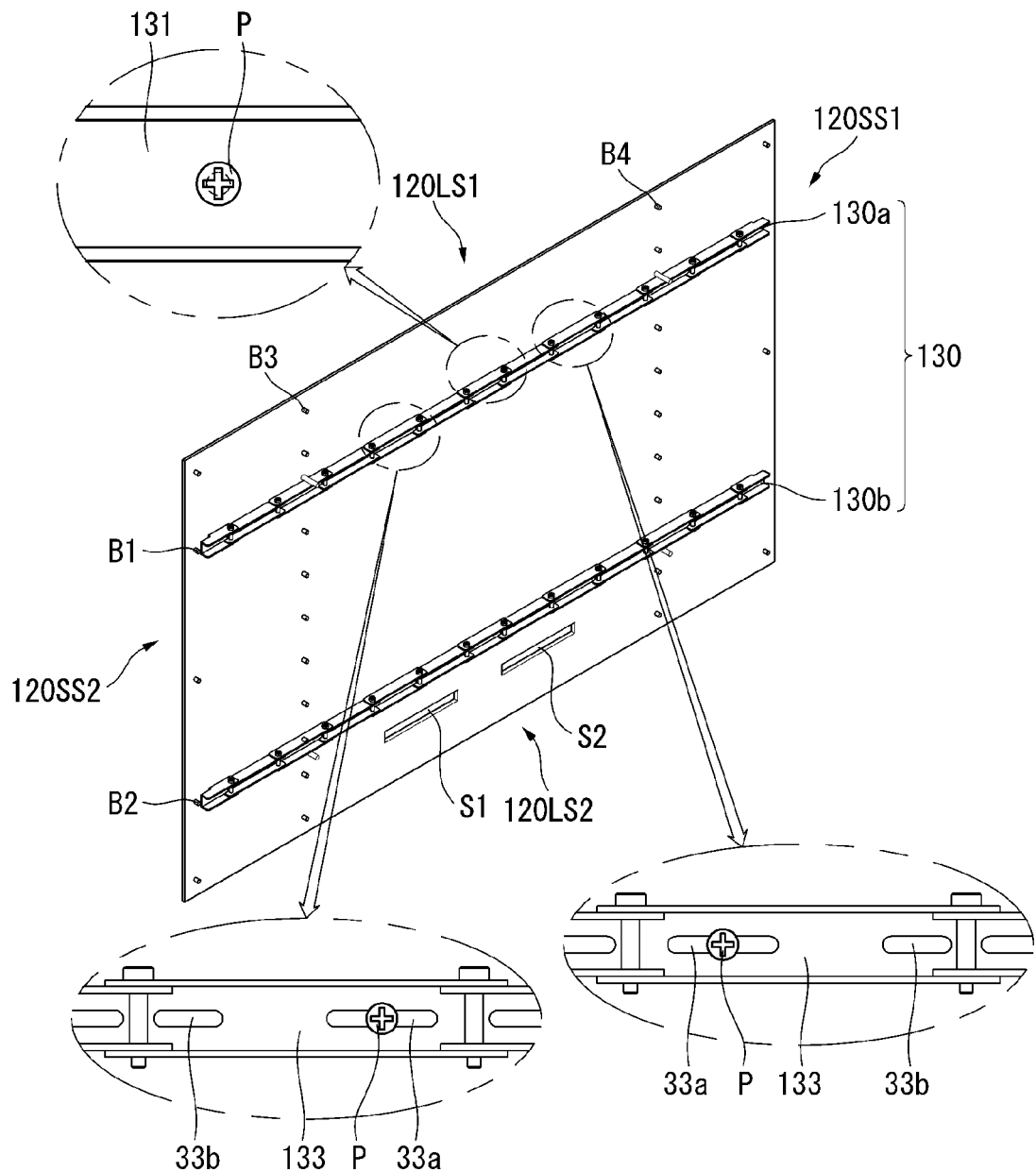
FIGS. 10 to 12 are views showing changes of the curvature of the flexible jig and the plate according to an embodiment of the present invention.

Referring to FIG. 10, the first flexible jig 130a may be adjacent to the first long side 120LS1 of the plate 120. The first plurality of bosses B1 may be inserted into the first flexible jig 130a. The second flexible jig 130b may be positioned adjacent to the second long side 120LS2 of the plate 120. The second plurality of bosses B2 may be inserted into the second flexible jig 130b.

In FIG. 10, the first flexible jig 130a will be mainly described, and a description of the second flexible jig 130b having the same configuration as that of the first flexible jig 130a will be omitted.

One of the first plurality of bosses B1 may be inserted into the inner hole 31 (see FIG. 8) of the first segment 131. The fastening member P can be fastened to the boss B1 inserted into the inner hole 31 (see FIG. 8). The first segment 131 of the first flexible jig 130a may be coupled or fastened to the center of the plate 120. The center of the plate 120 may be with reference to the left-right direction LR.

The third segment 133 may include a plurality of inner holes 33a and 33b. For example, the plurality of inner holes 33a and 33b of the third segment 133 may include a thirty-first inner hole 33a and a thirty-second inner hole 33b. The thirty-first inner hole 33a may be located on a side of the third segment 133. The thirty-second inner hole 33b may be located on the other side of the third segment 133. One of the first plurality of bosses B1 may be inserted into the thirty-first inner hole 33a or the thirty-second inner hole 33b. The fastening member P can be fastened to the boss B1 inserted into the thirty-first inner hole 33a or the thirty-second inner hole 33b. The third segment 133 of the first flexible jig 130a may be coupled or fastened to the left and right sides of the center of the plate 120.

The inner holes 33a and 33b may be elongated in the longitudinal direction of the third segment 133 or in the left-right direction LR. The inner holes 33a and 33b may form a fastening gap or a clearance space. Even if the third segment 133 is coupled to the plate 120 by the fastening member P, the third segment 133 can move or slide leftward and rightward with respect to the boss B1. The fastening member P may be located at the center of the inner holes 33a and 33b.

Figure 11:
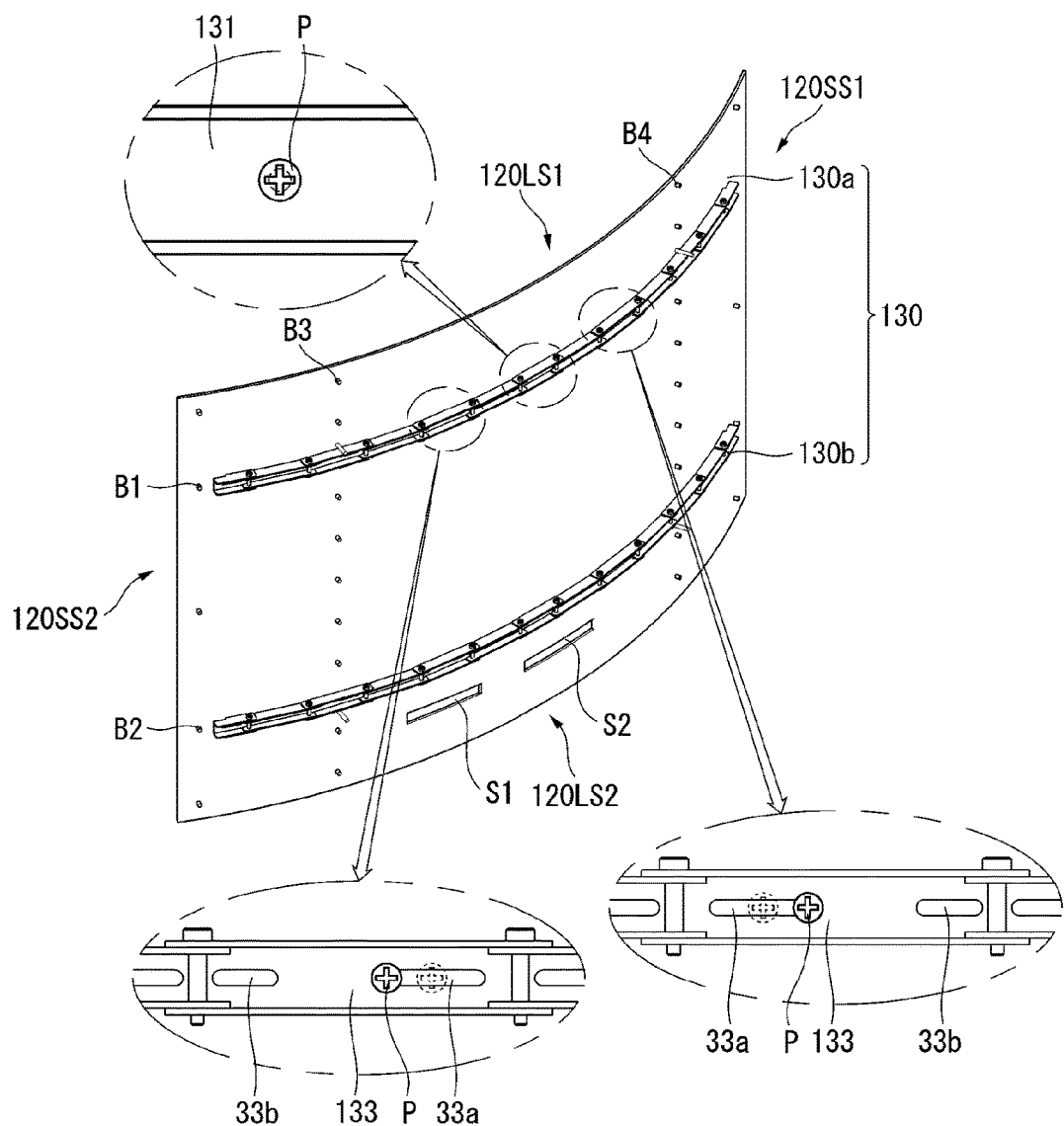

Referring to FIG. 11, toward the front of the display device 100, the first flexible jig 130a may be concave.

Even if the first flexible jig 130a is concave, the first segment 131 can be fixed to the center of the plate 120 with reference to left-right direction LR.

In a process in which the first flexible jig 130a is bent or curved concavely, the third segment 133 can move or slide with respect to the coupled boss B1. The third segment 133 can move or slide within a range allowed by the fastening gap or the clearance space. The fastening member P located at the center of the thirty-first inner hole 33a can move in the thirty-first inner hole 33a.

For example, when the plate 120 is concave toward the front of the plate 120, the fastening member P located in the thirty-first inner hole 33a of the third segment 133 is configured to move or slide toward the fourth side 120SS1 of the plate 120, wherein the thirty-first inner hole 33a is located between the first segment 131 and the fourth side 120SS1. When the plate 120 is concave toward the front of the plate 120, the fastening member P located in the thirty-first inner hole 33a of the third segment 133 is configured to move or slide toward the third side 120SS2 of the plate 120, wherein the thirty-first inner hole 33a is located between the first segment 131 and the third side 120SS2. The location of fastening member P may stand for the location of the first boss B1.

Figure 12:
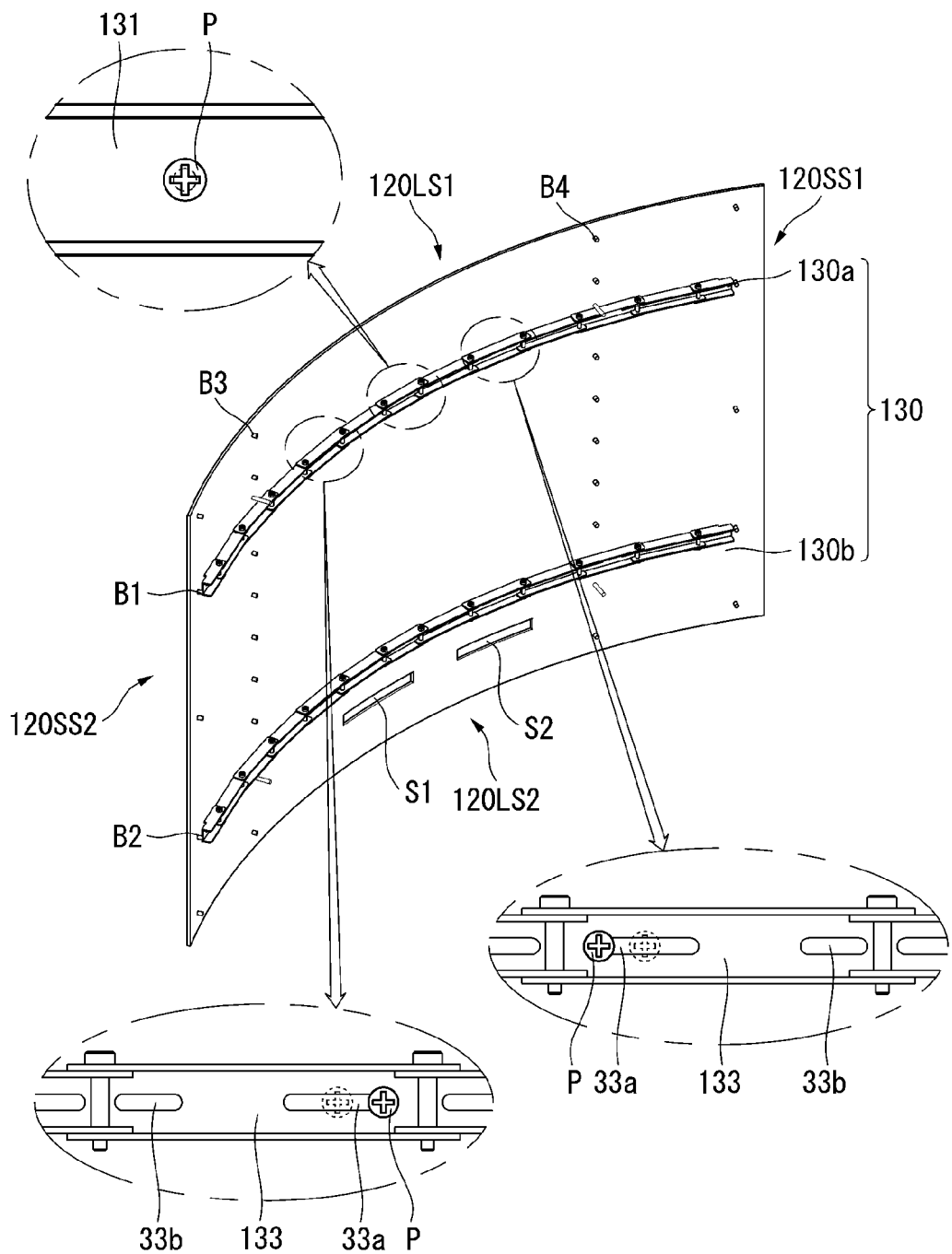

Referring to FIG. 12, toward the front of the plate 120, the first flexible jig 130a may be convexly curved or bent.

Even if the first flexible jig 130a is convex, the first segment 131 can be fixed to the center of the plate 120 with reference to left-right direction LR.

In a process in which the first flexible jig 130a is bent or curved convexly, the third segment 133 can move or slide with respect to the coupled boss B1. The third segment 133 can move or slide within a range allowed by the fastening gap or the clearance space. The fastening member P located at the center of the thirty-first inner hole 33a can move in the thirty-first inner hole 33a.

For example, when the plate 120 is concave toward the front of the plate 120, the fastening member P located in the thirty-first inner hole 33a of the third segment 133 is configured to move or slide toward the third side 120SS2 of the plate 120, wherein the thirty-first inner hole 33a is located between the first segment 131 and the fourth side 120SS1. When the plate 120 is concave toward the front of the plate 120, the fastening member P located in the thirty-first inner hole 33a of the third segment 133 is configured to move or slide toward the fourth side 120SS1 of the plate 120, wherein the thirty-first inner hole 33a is located between the first segment 131 and the third side 120SS2. The location of fastening member P may stand for the location of the first boss B1.

The first segment 131 of the first flexible jig 130a may be coupled to the central region of the plate 120 with reference to left-right direction LR. The second to fourth segments 132 to 134 of the first flexible jig 130a may be coupled to the rear surface of the plate 120.

The first segment 131 of the first flexible jig 130a may be fixedly coupled to the rear surface of the plate 120. The second to fourth segments 132 to 134 of the first flexible jig 130a can move or slide with respect to the plate 120 within the fastening gap or clearance of the inner holes 32, 33a, 33b, 34a, and 34b (see FIG. 8). Even though the plate 120 is coupled to the first and second flexible jigs 130a and 130b, the shape of the plate 120 may correspond to the shapes of the first and second flexible jigs 130a and 130b, or vice versa. For example, the plate 120 may correspond to the curved (or bent) shape of the first and second flexible jigs 130a and 130b.

Referring to FIG. 13, a plurality of flexible jigs 230 may be positioned on the rear surface of the plate 120.

For example, the first flexible jig 230a may be positioned adjacent to the first long side 120LS1 of the plate 120. The first flexible jig 230a may be coupled to a first plurality of bosses B1 arranged adjacent to the first long side 120LS1 of the plate 120. A plurality of fastening members (not shown) may be fastened to the first plurality of bosses B1. The first flexible jig 230a may be coupled to or fastened to the plate 120. The first flexible jig 230a can be divided into two parts: left and right parts. The left part of the first flexible jig 230a can be positioned adjacent to the third side 120SS2 of the plate 120. The left part of the first flexible jig 230a can be referred to as an eleventh flexible jig. The right part of the first flexible jig 230a can be positioned adjacent to the fourth side 120SS1 of the plate 120. The right part of the first flexible jig 230a can be referred to as a twelfth flexible jig.

The second flexible jig 230b may be positioned adjacent to the second long side 120LS2 of the plate 120. The second flexible jig 230b may be coupled to a second plurality of bosses B2 arranged adjacent to the second long side 120LS2 of the plate 120. The plurality of fastening members may be fastened to the second plurality of bosses B2. The second flexible jig 230b may be coupled or fastened to the plate 120.

Hereinafter, the first flexible jig 230a will be mainly described, and a description of the second flexible jig 230b having the same configuration as that of the first flexible jig 230a will be omitted.

Figure 14:
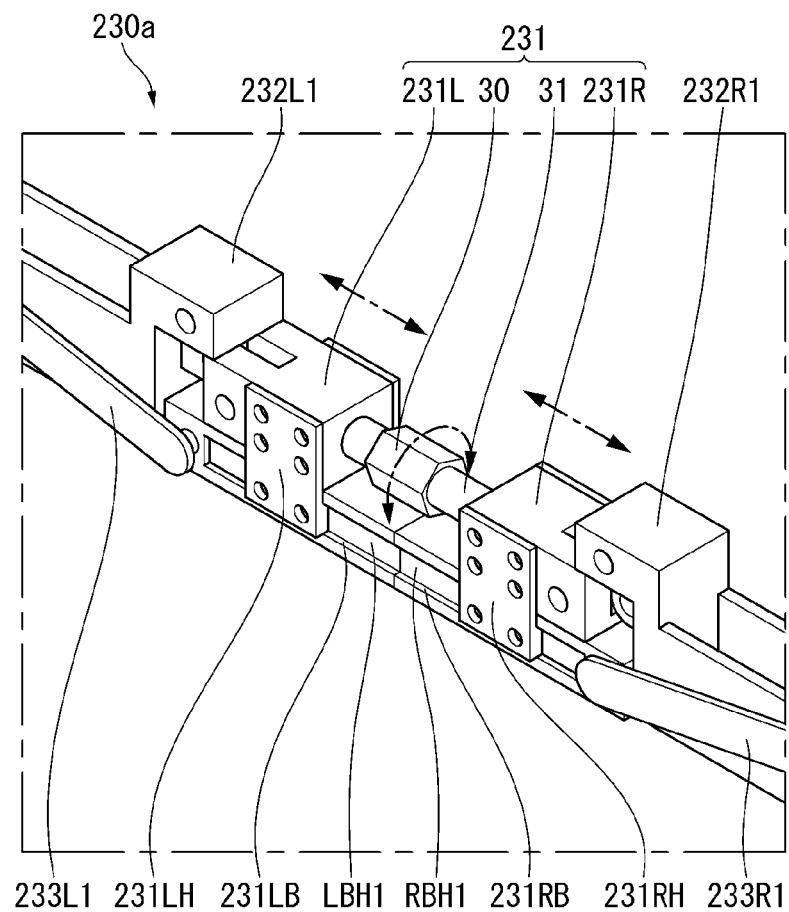
FIGS. 14 to 18 are views showing a control gadget and a flexible jig according to the other embodiment of the present invention.
Figure 15:
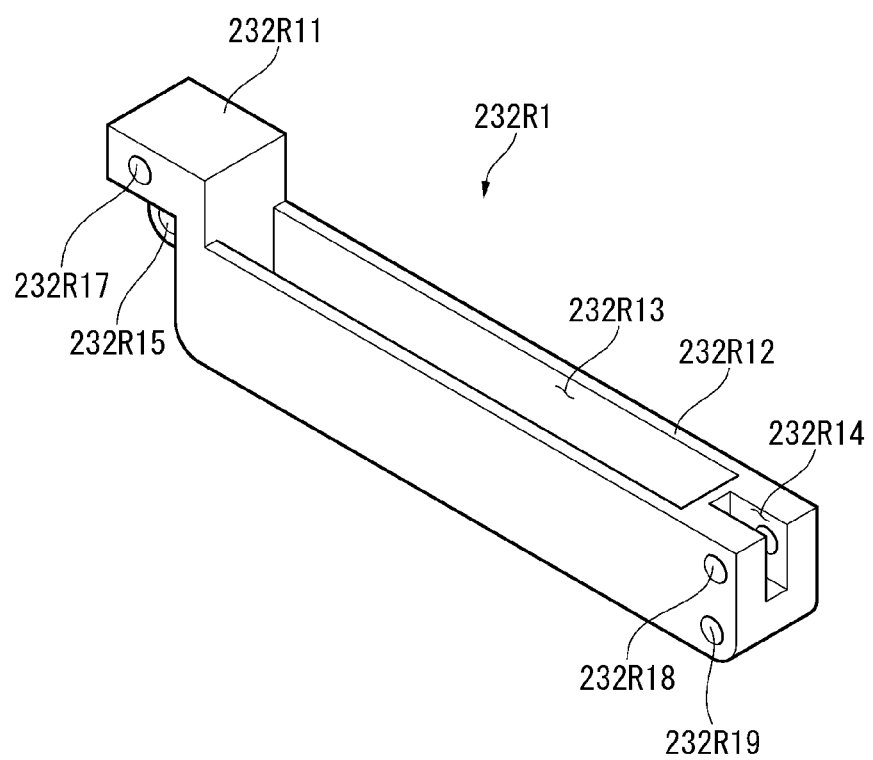
Figure 16:
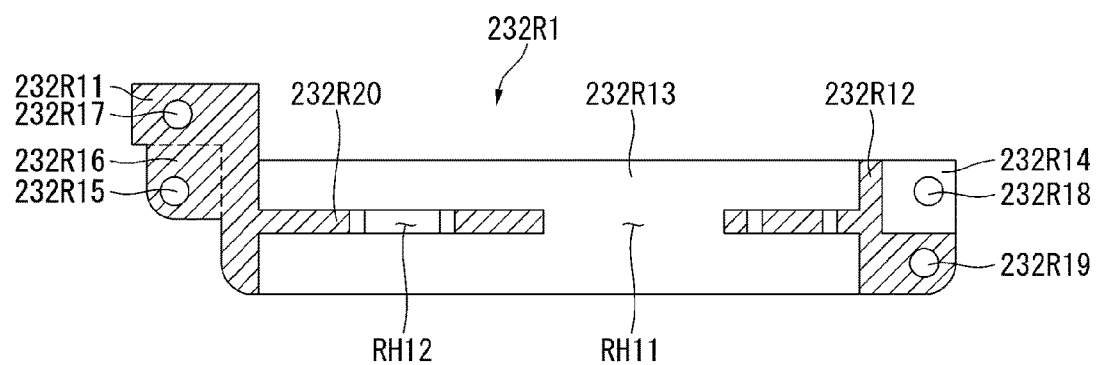
Figure 17:
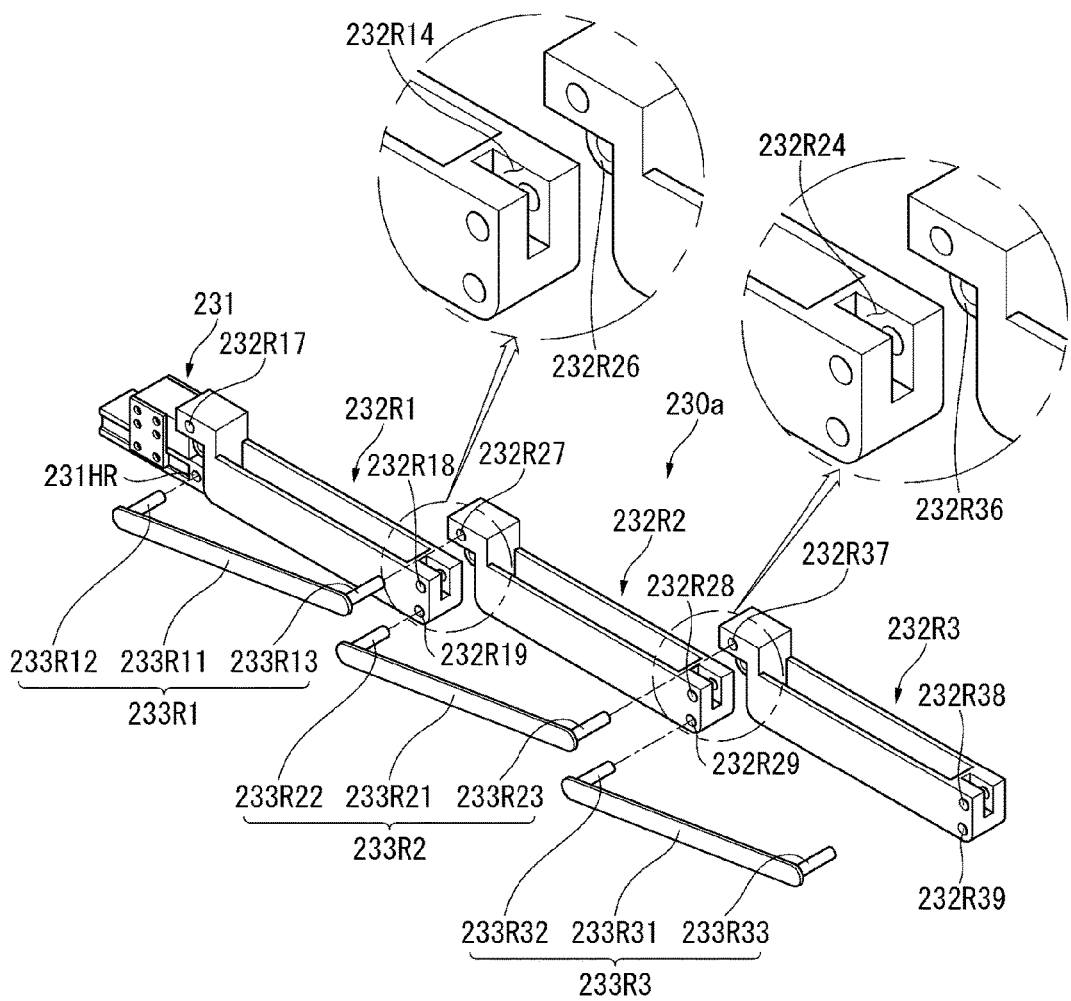
Figure 18:
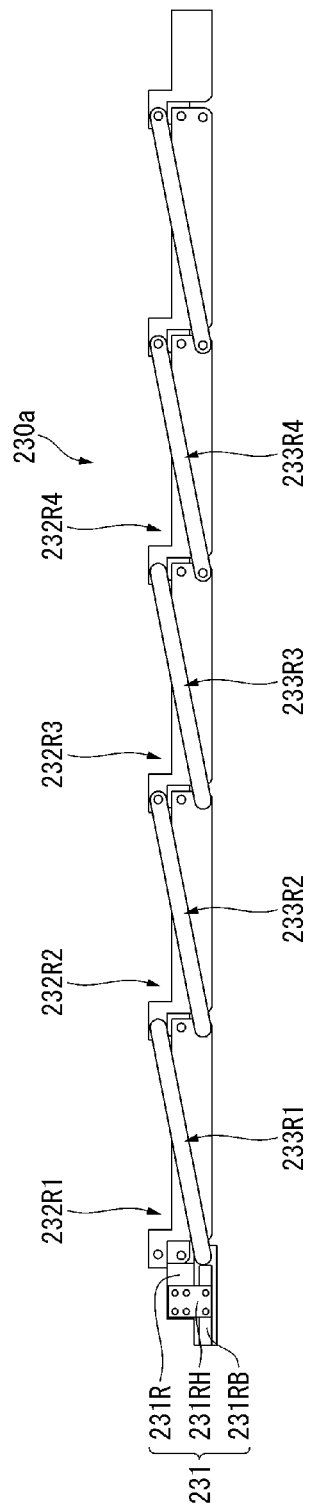

Referring to FIG. 14, the first flexible jig 230a may include a plurality of segments 232R and 232L and a plurality of links 233R and 233L. The plurality of segments 232R and 232L may be referred to as a plurality of rigid bars.

The control gadget 231 may be disposed between the plurality of segments 232R and 232L. For example, a plurality of R-segments 232R and a plurality of R-links 233R may be disposed on the right side of the control gadget 231. The plurality of L-segments 232L and the plurality of L-links 233L may be disposed on the left side of the control gadget 231. The right side may be one of the longitudinal directions of the plate 120, and the left side may be the opposite direction of the right side.

The control gadget 231 may include a lead screw 31, a dial 30, supporting bodies 231LB and 231RB, movable bodies 231L and 231R and guides 231LH and 231RH.

The lead screw 31 may be elongated in the longitudinal direction of the first flexible jig 230a. The longitudinal direction of the first flexible jig 120a may be a left-right direction LR. The lead screw 31 may have a cylindrical shape. A screw shape may be formed on the outer circumferential surface or the peripheral surface of the lead screw 31.

The lead screw 31 can be inserted into and fastened to the dial 30. The dial 30 may be disposed adjacent to the center of the lead screw 31. The dial 30 may be rotated in a first direction or a second direction. The first direction may be one of azimuthal directions with reference to the longitudinal direction of the lead screw 31. The second direction may be another of azimuthal directions with reference to the longitudinal direction of the lead screw 31. The second direction may be opposite to the first direction. The dial 30 or the lead screw 31 may be connected to a motor or the like. The dial 30 or the lead screw 31 can be rotated by the motor to control the curvature of the plate 120.

The supporting bodies 231LB and 231RB can be disposed in front of the dial 30 or the lead screw 31. The supporting bodies 231LB and 231RB can be spaced forwardly apart from the dial 30 or the lead screw 31. The supporting bodies 231LB and 231RB can include a first R-supporting body 231RB and a first L-supporting body 231LB.

The first R-supporting body 231RB may be disposed side-by-side with the first L-supporting body 231LB. The first L-supporting body 231LB may be coupled to the first R-supporting body 231RB. The dial 30 may be disposed behind the boundary between the first R-supporting body 231RB and the first L-supporting body 231LB.

The first R-supporting body 231RB may be hinged to the first R-link 233R1. The first R-supporting body 231RB may include a first R-guide groove RBH1. The first R-guide groove RBH1 may be elongated in the longitudinal direction of the lead screw 31.

The first L-supporting body 231LB may be hinged to the first L-link 233L1. The first L-supporting body 231LB may include a first L-guide groove LBH1. The first L-guide groove LBH1 may be elongated in the longitudinal direction of the lead screw 31. The first L-guide groove LBH1 can be communicated to the first R-guide groove RBH1.

The movable bodies 231L and 231R may be disposed on the rear of the supporting bodies 231LB and 231RB. The movable bodies 231L and 231R may include a first R-movable body 231R and a first L-movable body 231L.

The first R-movable body 231R may be disposed on the rear of the first R-supporting body 231RB. The first R-movable body 231R may be fastened or coupled to the right side of the lead screw 31. The first R-movable body 231R may be hinged to the first R-segment 232R1. The first R-segment 232R1 may be connected to the first R-movable body 231R. The first R-movable body 231R may be positioned between the dial 30 and the first R-segment 232R1. The first R-movable body 231R is movable along the lead screw 31. The first R-movable body 231R is movable, for example, leftward and/or rightward at the rear of the first R-supporting body 231RB in accordance with the rotation of the dial 30.

The first L-movable body 231L may be disposed at the rear of the first L-supporting body 231LB. The first L-movable body 231L may be fastened or coupled to the left side of the lead screw 31. The first L-movable body 231L may be hinged to the first L-segment 232L1. The first L-segment 232L1 may be connected to the first L-movable body 231L. The first L-movable body 231L may be positioned between the dial 30 and the first L-segment 232L1. The first L-movable body 231L is movable along the lead screw 31. The first L-movable body 231L is movable, for example, leftward and/or rightward at the rear of the first L-supporting body 231LB in accordance with the rotation of the dial 30.

The front portions of the guides 231LH and 231RH can be fitted in the guide grooves LH1 and RH1 of the supporting bodies 231LB and 231RB. The rear portions of the guides 231LH and 231RH can be fastened to the movable bodies 231L and 231R. The guides 231LH and 231RH may include a first R-guide 231RH and a first L-guide 231LH.

The front portion of the first R-guide 231RH can be fitted in the first R-guide groove RBH1. The rear portion of the first R-guide 231RH can be fastened to the first R-movable body 231R. The first R-movable body 231R can move on the rear surface of the first R-supporting body 231RB alongside of the first R-guide groove RBH1.

The front portion of the first L-guide 231LH can be fitted in the first L-guide groove LBH1. The rear portion of the first L-guide 231LH can be fastened to the first L-movable body 231L. The first L-movable body 231L can move on the rear surface of the first L-supporting body 231LB alongside of the first L-guide groove LBH1.

Referring to FIGS. 15 to 18, the first flexible jig 230a may include a plurality of R-segments 232R, a plurality of R-links 233R, a plurality of L-segments 232L, and a plurality of L-links 233L.

The plurality of R-segments 232R and the plurality of R-links 233R may be hinged to the control gadget 231. The plurality of L-segments 232L and the plurality of L-links 233L may be hinged to the control gadget 231. The control gadget 231 may be positioned between the R-segment 232R and the L-segment 232L.

The first R-segment 232R1 may include a first R-segment body 232R12. The first R-segment body 232R12 may be elongated in the left-right direction. An inner groove 232R13 can be form on the first R-segment body 232R12. The inner groove 232R13 of the first R-segment 232R1 can be elongated in a longitudinal direction of the first R-segment body 232R12. The inner groove 232R13 can be open forward and rearward. The first R-segment 232R1 may include a first R-receiving node 232R14, a first R-link connection node 232R11, and a first R-hinge connection node 232R16.

The first R-receiving node 232R14 may be located on the upper portion of the first R-segment body 232R12, at a side of the first R-segment body 232R12. The first R-receiving node 232R14 may be recessed toward the interior of the first R-segment body 232R12. The first R-receiving node 232R14 may have a width smaller than the width of the first R-segment body 232R12.

The first R-link connection node 232R11 can be located on the upper portion of the first R-segment body 232R12, at another side of the first R-segment body 232R12. The first R-link connection node 232R11 can be located opposite to the first R-receiving node 232R14, with reference to the first R-segment body 232R12. In particular, the first R-link connection node 232R11 can be located opposite to the first R-receiving node 232R14, with reference to the inner groove 232R13 of the first R-segment body 232R12. The first R-link connection node 232R11 can protrude toward opposite the first R-receiving node 232R14.

The first R-hinge connection node 232R16 may be located at the lower portion of the first R-link connection node 232R11, at the other side of the first R segment body 232R12. The first R-hinge connection node 232R16 may be located adjacent to the first R-link connection node 232R11. For example, the first R-hinge connecion node 232R16 can be located at a lower of the first R-link connection node 232R11. The first R-hinge connection node 232R16 can be located opposite to the first R-receiving node 232R14, with reference to the first R-segment body 232R12. The first R-hinge connection node 232R16 may have a width smaller than the width of the first R-segment body 232R12. The width of the first R-hinge connection node 232R16 may be substantially equal to or less than the width of the first R-receiving node 232R14.

The first R-segment 232R1 may include a plurality of R-segment holes 232R15, 232R17, 232R18, and 232R19. The plurality of R-segment holes 232R15, 232R17, 232R18, and 232R19 may include: a first R-segment first hole 232R18; a first R-segment second hole 232R19; a first R-segment third hole 232R11; and a first R-segment fourth hole 232R15.

The first R-segment first hole 232R18 may be located in the first-R receiving node 232R14. The first R-segment first hole 232R18 may be communicated with the first-R receiving node 232R14.

The first R-segment second hole 232R19 can be located at a lower of the first R-segment first hole 232R18. The first R-segment second hole 232R19 can be spaced apart from the first R-segment first hole 232R18. The first R-segment second hole 232R19 can pass through the first R-segment body 232R12.

The first R-segment third hole 232R17 can be located at the first R-link connection node 232R11. The first R-segment third hole 232R17 can pass through the first R-link connection node 232R11.

The first R-segment fourth hole 232R15 can be located at the first R-hinge connection node 232R15. The first R-segment fourth hole 232R15 can pass through the first R-hinge connection node 232R15.

A first R-bottom board 232R20 may be disposed in the inner groove 232R13. The first R-bottom board 232R20 can be referred to as a bottom board 232R20. The bottom board 232R20 may be disposed adjacent to the central region of the inner groove 232R13 with reference to the front-back direction.

The bottom board 232R20 may have a plurality of first R-bottom holes RH1 and RH2. The plurality of first R-bottom holes RH1 and RH2 may include a first R-bottom first hole RH1 and a first R-bottom second hole RH2. The first R-bottom first hole RH1 may be located adjacent to the first R-receiving node 232R14. The first R-bottom second hole RH2 may be located adjacent to the first R-link connection node 232R11 or the first R-hinge connection node 232R16. The first R-bottom first hole RH1 and the first R-bottom second hole RH2 may be elongated in the left-right direction. The left-right direction can be a direction parallel to the direction from the first R-hinge connection node 232R16 to the first R-receiving node 232R14. The first R-bottom first hole RH1 and the first R-bottom second hole RH2 may be formed larger than the diameters of the first plurality of bosses B1 or the second plurality of bosses B2. The first R-bottom first hole RH1 and the first R-bottom second hole RH2 may form a fastening gap or a clearance, when the first R-bottom first hole RH1 and the first R-bottom second hole RH2 are coupled to the first plurality of bosses B1 or the second plurality of bosses B2.

The second R-segment 232R2 and the third R-segment 232R3 may have the almost same configuration as the first R-segment 232R1.

The plurality of R-links 233R may include a first R-link 233R1 to a third R-link 233R3.

The first R-link 233R1 may include a first R-link body 233R11, a first R-link first coupling rod 233R13, and a first R-link second coupling rod 233R12.

The first R-link body 233R11 can be elongated in the left-right direction.

The first R-link first coupling rod 233R13 may be disposed at an end of the first R-link body 233R11. The first R-link first coupling rod 233R13 may protrude and may be crossed with the first R-link body 233R11.

The first R-link second coupling rod 233R12 may be disposed at another end of the first R-link body 233R11. The first R-link second coupling rod 233R12 may protrude and may be crossed with the first R-link body 233R11. The first R-link second coupling rod 233R12 may protrude in the same direction with the first R-link first coupling rod 233R13.

The plurality of R-segments 232R and the plurality of R-links 233R may be hingely coupled to the control gadget 231.

The first R-supporting body 231RB may include a first R-supporting body hole 231HR. The first R-supporting body hole 231HR can be located at a lower portion of the first R-supporting body 232RB. The first R-supporting body hole 231HR can be located adjacent to the first R-segment 232R1.

The first R-segment 232R1 may be disposed between the control gadget 231 and the second R-segment 232R2. The first R-receiving node 232R14 of the first R-segment 232R1 can be coupled to the second R-hinge connection node 232R26 of the second R-segment 232R2. The first R-hinge connection node 232R16 can be hingely coupled to the first R-movable body 231R of the control gadget 231.

The first R-link 233R1 can be coupled to the control gadget 231 and the second R-segment 232R2. The first R-link first coupling rod 233R13 can be coupled to the second R-segment 232R2. For example, the first R-link first coupling rod 233R13 can be inserted into and coupled to the second R-segment third hole 232R27. The first R-link second coupling rod 233R12 can be inserted into and coupled to the first R-supporting body hole 231HR.

The second R-segment 232R2 can be positioned between the first R-segment 232R1 and the third R-segment 232R3. The second R-segment 232R2 can couple the first R-segment 232R1 with the third R-segment 232R3.

The second R-receiving node 232R24 of the second R-segment 232R2 can be coupled to the third R-hinge connection node 232R36 of the third R-segment 232R3. The second R-hinge connection node 232R26 can be inserted into and coupled to the R-receiving node 232R14 of the first R-segment 232R1.

The second R-link 233R2 can couple the first R-segment 232R1 with the third R-segment 232R3. The second R-link first coupling rod 233R23 can be inserted into and coupled to the third R-segment third hole 232R37 of the third R-segment 232R3. The second R-link second coupling rod 233R22 can be inserted into and coupled to the first R-segment second hole 232R19 of the first R-segment 232R1.

The third R-segment 232R3 can be positioned between the second R-segment 232R2 and the fourth R-segment 232R4. The third R-segment 232R3 can couple the second R-segment 232R2 with the fourth R-segment 232R4.

The third R-receiving node 232R34 of the third R-segment 232R3 can be coupled to the fourth R-hinge connection node (not shown) of the fourth R-segment 232R4. The third R-hinge connection node 232R36 can be inserted into and coupled to the second R-receiving node 232R14 of the second R-segment 232R2.

The third R-link 233R3 can couple the second R-segment 232R2 with the fourth R-segment 232R4. The third R-link first coupling rod 233R33 can be inserted into and coupled to the fourth R-segment third hole (not shown) of the fourth R-segment 232R4. The third R-link second coupling rod 233R22 can be inserted into and coupled to the second R-segment second hole 232R29 of the second R-segment 232R2.

Figure 19:
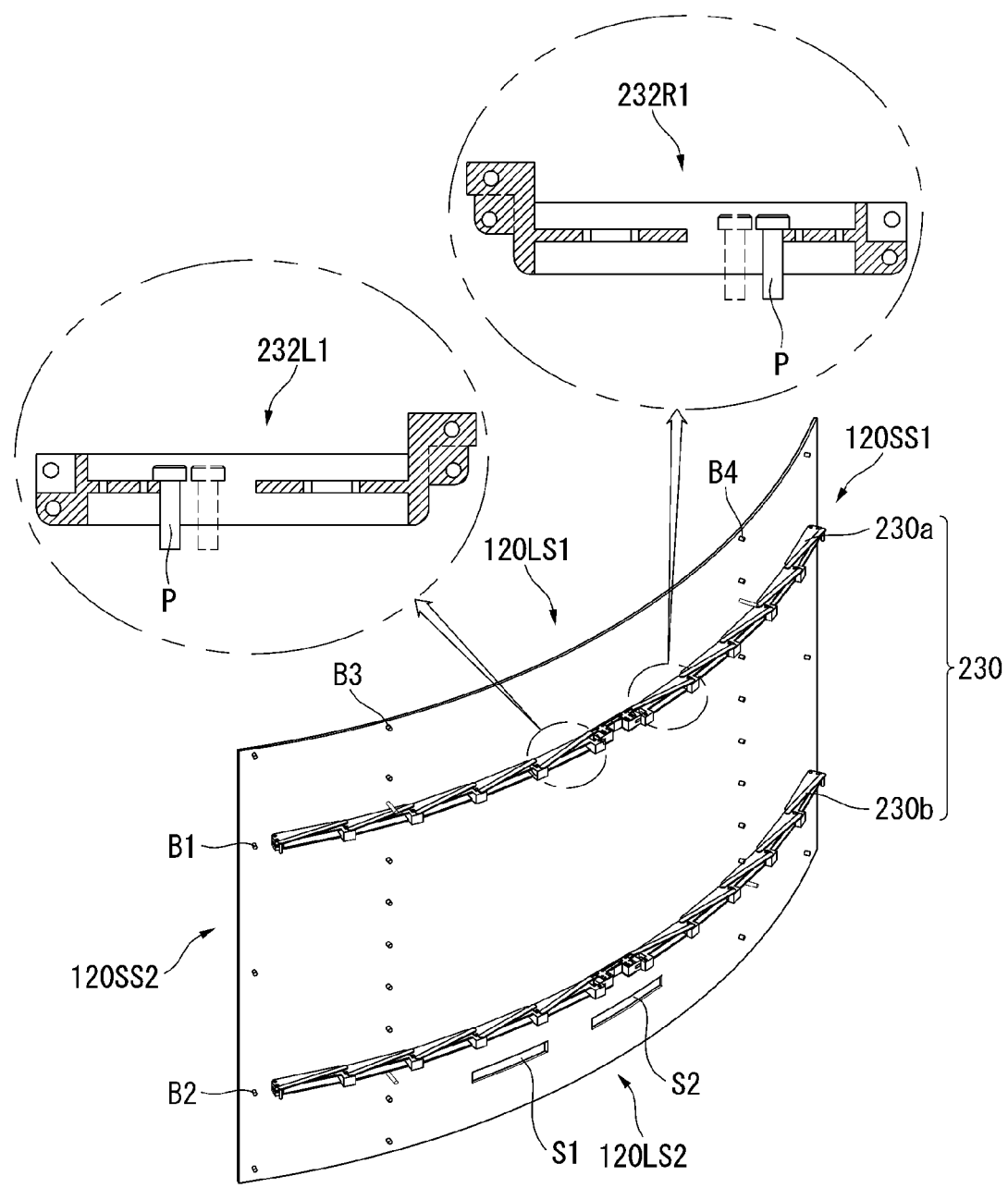
FIGS. 19 to 22 are views illustrating changes of the curvature of the flexible jig and the plate according to the other embodiment of the present invention.
Figure 20:
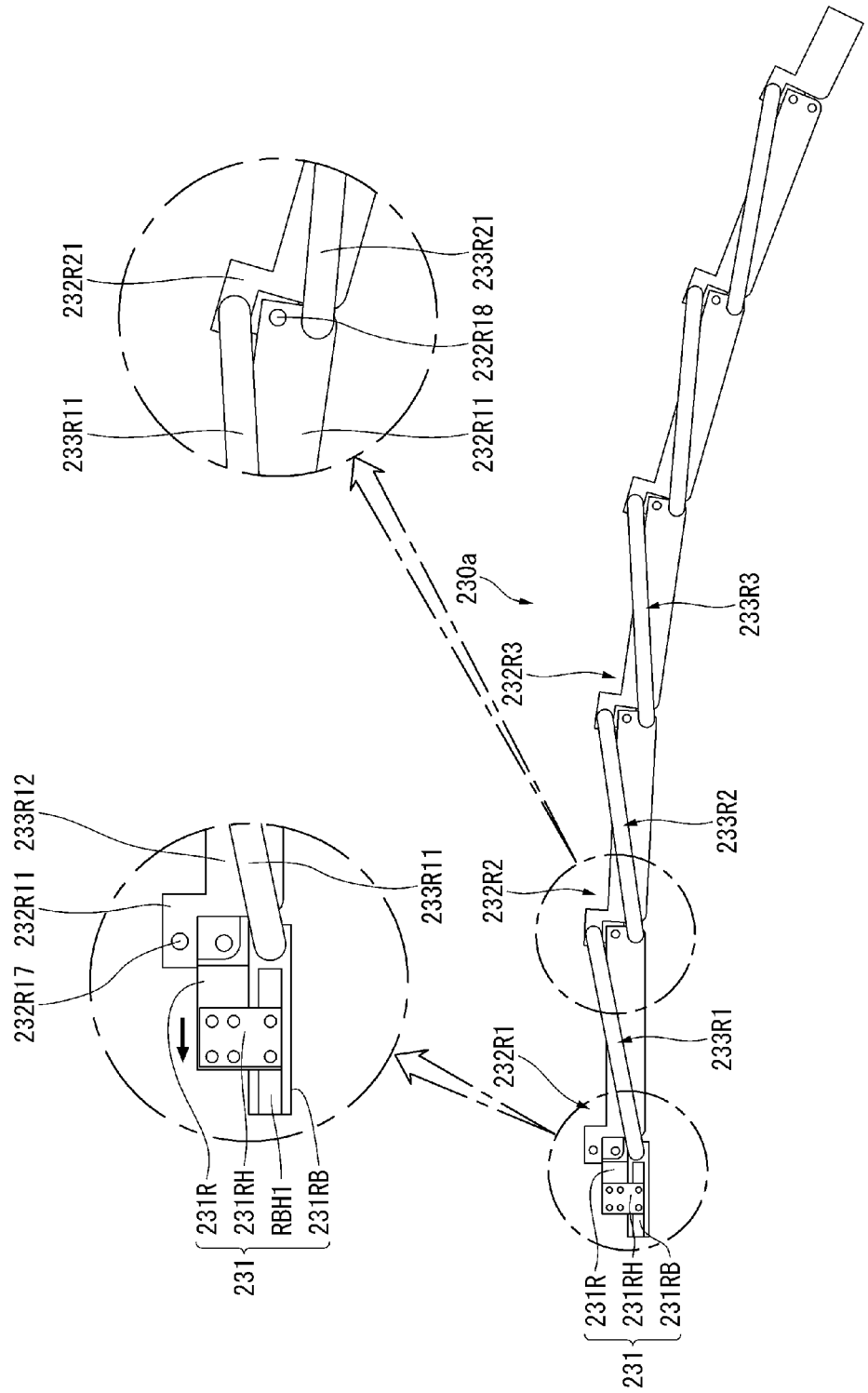

Referring to FIGS. 19 and 20, the first flexible jig 230a can be concavely curved or bent toward the front of the display device 100.

The control gadget 231 may be fixed to a central region of the plate 120, with reference to the left-right direction. When the dial 30 of the control gadget 231 rotates, the first R-movable body 231R and the first L-movable body 231L which are connected to the lead screw 31 can move left and right or vice versa. When the dial 30 of the control gadget 231 rotates, the first R-movable body 231R and the first L-movable body 231L becomes closer or away. The distance from the first R-movable body 231R to the first L-movable body 231L can vary dependent on the rotation of the dial 30.

When the dial 30 of the control gadget 231 rotates in the first direction, the moving bodies 231L and 231R which are connected to the lead screw 31 can become closer to the control gadget 231. When the dial 30 of the control gadget 231 rotates in the first direction, the first R-movable body 231R can move toward the control gadget 231, and the first L-movable body 231L can move toward the control gadget 231. The distance between the first R-movable body 231R and the first L-movable body 231L can be shortened, when the dial 30 of the control gadget 231 rotates in the first direction.

When the dial 30 rotates in the first direction, the first R-movable body 231R can move toward the dial 30 (toward left). When the first R-movable body 231R moves toward the dial 30 (or the control gadget 231), the first R-movable body 231RB can pull the first R-segment 232R1 toward the control gadget 231. When first R-movable body 231R pulls the first R-segment 232R1 toward the control gadget 231, the first R-segment 232R1 can pull the second R-segment 232R2 toward the first R-segment 232R1. The point of action of the force from the first R-segment 232R1 to the second first R-segment 232R2, can be the second R-hinge connection node 232R26 (see FIG. 17) of the second R-segment 232R2, which can be referred to as a first point of action. Both ends of the first R-link 233R1 can be rotatably coupled to the first R-supporting body 231RB and the second R-segment 232R2 respectively. When the second R-segment 232R2 is pulled by the first R-segment 232R1 toward the first R-segment 232R1, the first R-link 233R1 can resist the movement of the second R-segment 232R2 toward the first R-segment 232R1. The point of action of the force from the first R-link 233R1 to the second R-segment 232R2, can be second R-segment third hole 232R27 (see FIG. 17), which can be referred to as a second point of action. The second point of action can be positioned behind the first point of action. Therefore, the second R-segment 232R2 can be bent with respect to the first R-segment 232R1, when the first R-movable body 231R moves toward the dial 30 (or the control gadget 231), which may mean that the first and second R-segment 232R1 and 232R2 can become concave toward forward. When the first and second R-segment 232R1 and 232R2 can become concave toward forward, the second R-segment 232R2 can pull the third R-segment 232R3 toward forward with reference to the first R-segment 232R1. The force from the second R-segment 232R2 to the third R-segment 232R3 can be referred to as a reference force. The point of action from the second R-segment 232R2 to the third R-segment 232R3, can be the second R-segment first hole 232R28, can be referred to as a third point of action. The third point of action can be rotatable with respect to the second R-segment fourth hole 232R18. The line from the third point of action to the second R-segment fourth hole 232R18 can be referred to as a third line. The angle between the reference force and the third line can be referred to as a third angle. The moment at the third point of action with respect to the the second R-segment fourth hole 232R18 can be referred to as a third moment. The third moment can depend on the third angle and the third line. When the second R-segment 232R2 pulls the third R-segment 232R3 toward forward, the third R-segment third hole 232R37 (see FIG. 17) can be pulled toward forward. The third R-segment third hole 232R37 can be referred to as a fourth point of action. The third R-segment third hole 232R37 can be rotatably coupled to the second R-link 233R2. The second R-link 233R2 can be rotatably coupled to the first R-segment 232R1 at the first R-segment second hole 232R19. The line from the fourth point of action to the first R-segment second hole 232R19 can be referred to as a fourth line. The angle between the reference force and the fourth line can be referred to as a fourth angle. The length of the fourth line may be greater than the length of the third line. The moment at the fourth point of action with respect to the first R-segment second hole 232R19 can be referred to as a fourth moment. The fourth moment can depend on the fourth angle and the fourth line. The third moment can be different from the fourth moment, in terms of strength and direction. The difference between the third and fourth moment can result in the bending of the second and third R-segments 232R2 and 232R3.

The first flexible jig 230a can become concave toward forward.

When the first flexible jig 230a become concave toward forward, a first boss B1 can move along the first R-bottom first hole RH11 (see FIG. 16) of the first R-segment 232R1, or vice versa. When the first flexible jig 230a become concave toward forward, the fastening member P can move toward left or right.

For example, when the first flexible jig 230a become concave toward forward, the fastening member P coupled to the first R-segment 232R1 can move toward fourth side 120SS1 of the plate 120.

For example, when the first flexible jig 230a become concave toward forward, the fastening member P coupled to the first L-segment 232L1 can move toward third side 120SS2 of the plate 120.

Figure 21:
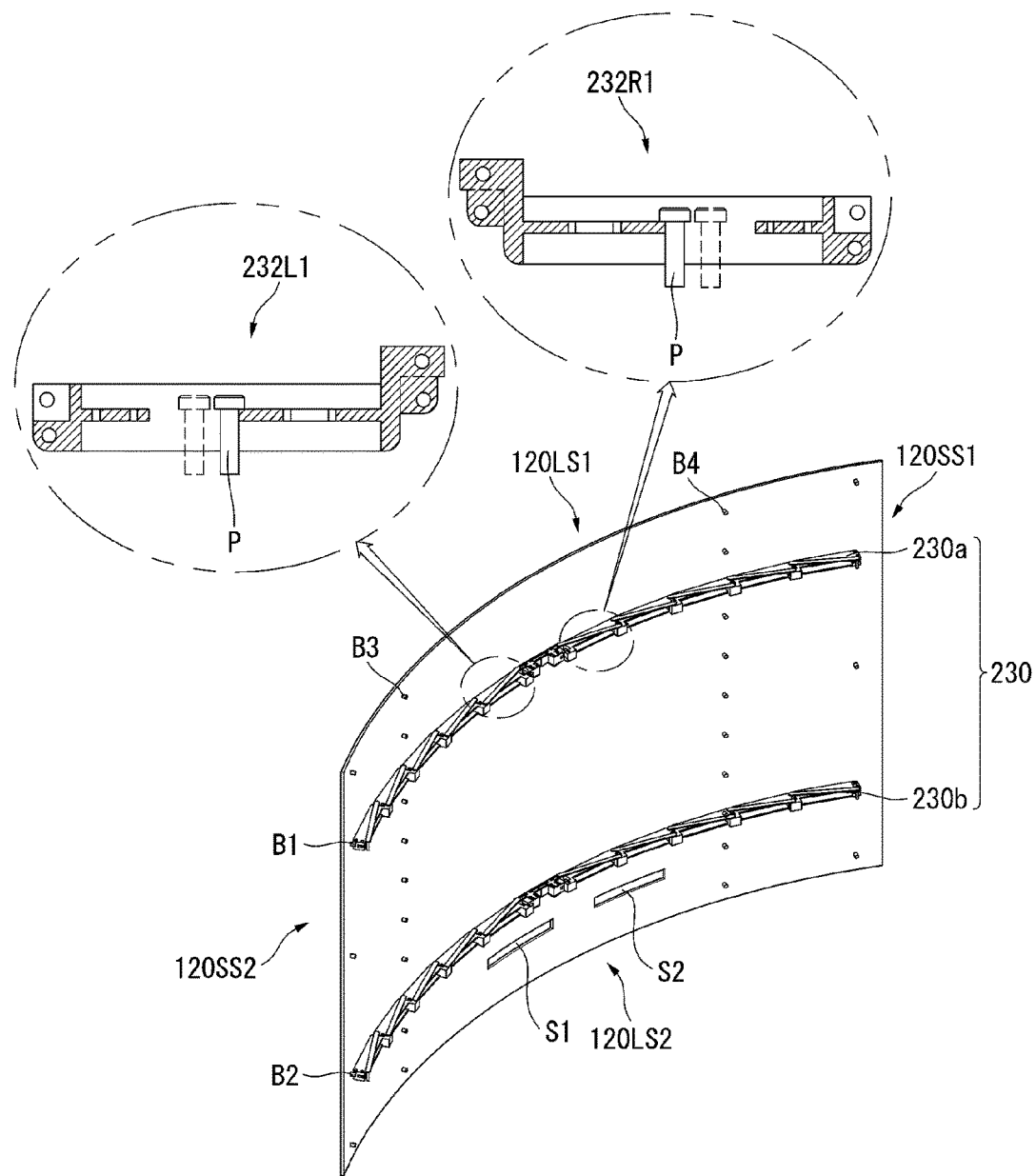
Figure 22:
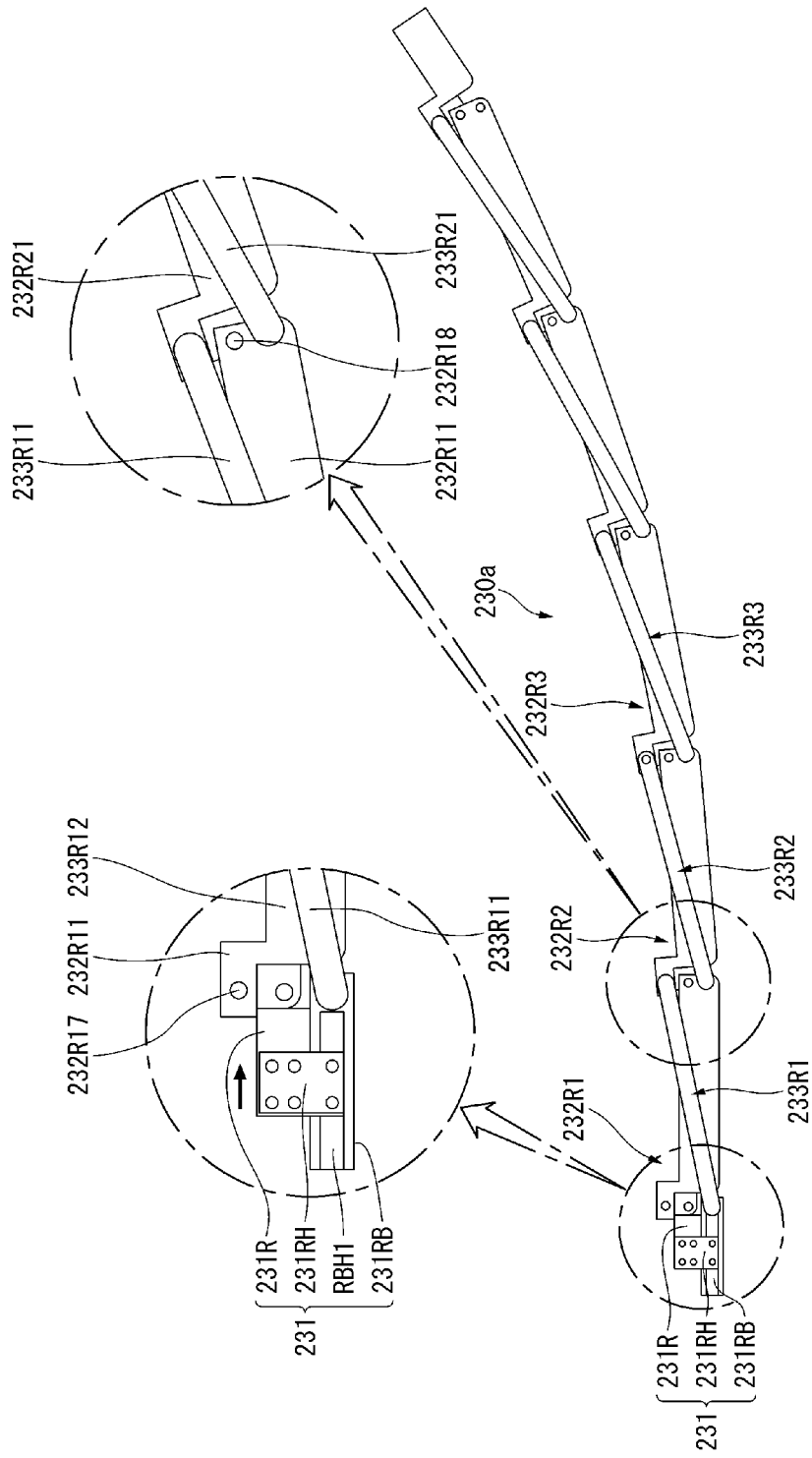

Referring to FIGS. 21 and 22, the first flexible jig 230a can be convexly curved toward forward.

The control gadget 231 may be fixed to a central region of the plate 120, with reference to the left-right direction. When the dial 30 of the control gadget 231 rotates, the first R-movable body 231R and the first L-movable body 231L which are connected to the lead screw 31 can move left and right or vice versa. When the dial 30 of the control gadget 231 rotates, the first R-movable body 231R and the first L-movable body 231L becomes closer or away. The distance from the first R-movable body 231R to the first L-movable body 231L can vary dependent on the rotation of the dial 30.

When the dial 30 of the control gadget 231 rotates in the second direction, the moving bodies 231L and 231R which are connected to the lead screw 31 can become away from the control gadget 231. When the dial 30 of the control gadget 231 rotates in the second direction, the first R-movable body 231R can move away from the control gadget 231, and the first L-movable body 231L can move away from the control gadget 231. The distance between the first R-movable body 231R and the first L-movable body 231L can be lengthened, when the dial 30 of the control gadget 231 rotates in the second direction.

When the dial 30 rotates in the second direction, the first R-movable body 231R can move away from the dial 30 (toward right). When the first R-movable body 231R moves away from the dial 30 (or the control gadget 231), the first R-movable body 231RB can push the first R-segment 232R1 away from the control gadget 231. When first R-movable body 231R pushes the first R-segment 232R1 away from the control gadget 231, the first R-segment 232R1 can push the second R-segment 232R2 away from the first R-segment 232R1. The point of action of the force from the first R-segment 232R1 to the second first R-segment 232R2, can be the second R-hinge connection node 232R26 (see FIG. 17) of the second R-segment 232R2, which can be referred to as a first point of action. Both ends of the first R-link 233R1 can be rotatably coupled to the first R-supporting body 231RB and the second R-segment 232R2 respectively. When the second R-segment 232R2 is pushed by the first R-segment 232R1 away from the first R-segment 232R1, the first R-link 233R1 can resist the movement of the second R-segment 232R2 away from the first R-segment 232R1. The point of action of the force from the first R-link 233R1 to the second R-segment 232R2, can be second R-segment third hole 232R27 (see FIG. 17), which can be referred to a second point of action. The second point of action can be positioned behind the first point of action. Therefore, the second R-segment 232R2 can be bent with respect to the first R-segment 232R1, when the first R-movable body 231R moves away from the dial 30 (or the control gadget 231), which may mean that the first and second R-segment 232R1 and 232R2 can become convex toward forward. When the first and second R-segments 232R1 and 232R2 can become convex toward forward, the second R-segment 232R2 can push the third R-segment 232R3 toward rearward with reference to the first R-segment 232R1. The force from the second R-segment 232R2 to the third R-segment 232R3 can be referred to as a reference force. The point of action from the second R-segment 232R2 to the third R-segment 232R3, can be the second R-segment first hole 232R28, can be referred to as a third point of action. The third point of action can be rotatable with respect to the second R-segment fourth hole 232R18. The line from the third point of action to the second R-segment fourth hole 232R18 can be referred to as a third line. The angle between the reference force and the third line can be referred to as a third angle. The moment at the third point of action with respect to the the second R-segment fourth hole 232R18 can be referred to as a third moment. The third moment can depend on the third angle and the third line. When the second R-segment 232R2 pushes the third R-segment 232R3 toward rearward, the third R-segment third hole 232R37 (see FIG. 17) can be pushed toward rearward. The third R-segment third hole 232R37 can be referred to as a fourth point of action. The third R-segment third hole 232R37 can be rotatably coupled to the second R-link 233R2. The second R-link 233R2 can be rotatably coupled to the first R-segment 232R1 at the first R-segment second hole 232R19. The line from the fourth point of action to the first R-segment second hole 232R19 can be referred to as a fourth line. The angle between the reference force and the fourth line can be referred to as a fourth angle. The length of the fourth line may be greater than the length of the third line. The moment at the fourth point of action with respect to the first R-segment second hole 232R19 can be referred to as a fourth moment. The fourth moment can depend on the fourth angle and the fourth line. The third moment can be different from the fourth moment, in terms of strength and direction. The difference between the third and fourth moment can result in the bending of the second and third R-segments 232R2 and 232R3.

The first flexible jig 230a can become convex toward forward.

When the first flexible jig 230a become convex toward forward, a first boss B1 can move along the first R-bottom first hole RH11 (see FIG. 16) of the first R-segment 232R1, or vice versa. When the first flexible jig 230a becomes convex toward forward, the fastening member P can move toward left or right.

For example, when the first flexible jig 230a becomes convex toward forward, the fastening member P coupled to the first R-segment 232R1 can move toward third side 120SS2 of the plate 120.

For example, when the first flexible jig 230a become convex toward forward, the fastening member P coupled to the first L-segment 232L1 can move toward fourth side 120SS1 of the plate 120.

As described above, the control gadget 231 can be coupled to the central region of the plate 120 with reference to the left-right direction. The first to fourth R-segments 232R1 to 232R3 of the first flexible jig 230a may be coupled to the rear surface of the plate 120.

The control gadget 231 may be fixedly coupled to the rear surface of the plate 120. The first R-segment 232R1 to the third R-segment 232R3 can move left and/or right on the plate 120 within a range allowed by the engagement gap of the bottom holes RH1 and RH2. The shape of the plate 120 may correspond to the shape of the first and second flexible jigs 230. The plate 120 can cope with the bending of the first and second flexible jigs 230.

The plurality of segments 232R and 232L of the first and second flexible jigs 230 may be sequentially coupled by a hinge. The plurality of segments 232R and 232L of the first and second flexible jigs 230 can be coupled with each other by a plurality of links 233R and 233L. The first and second flexible jigs 230 can be bent or curved.

Figure 23:
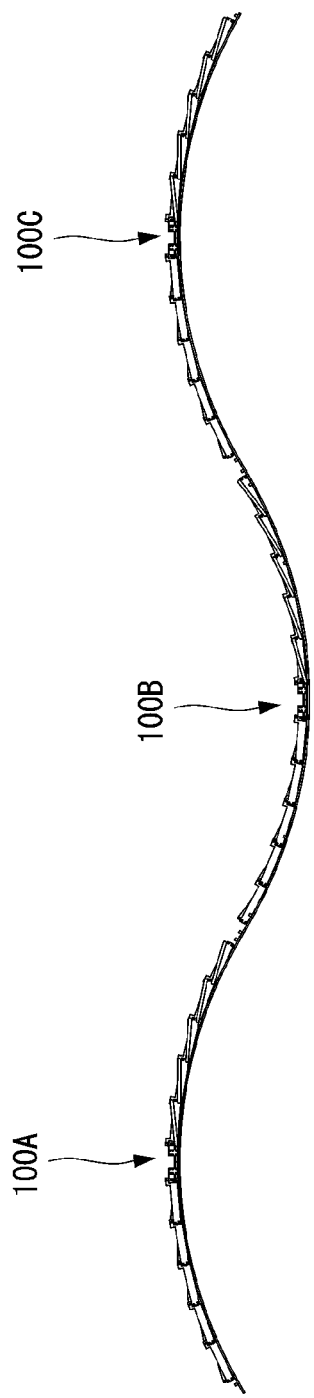
FIGS. 23 to 25 are views illustrating changes of the curvature of the multi-display device according to an embodiment of the present invention.
Figure 24:
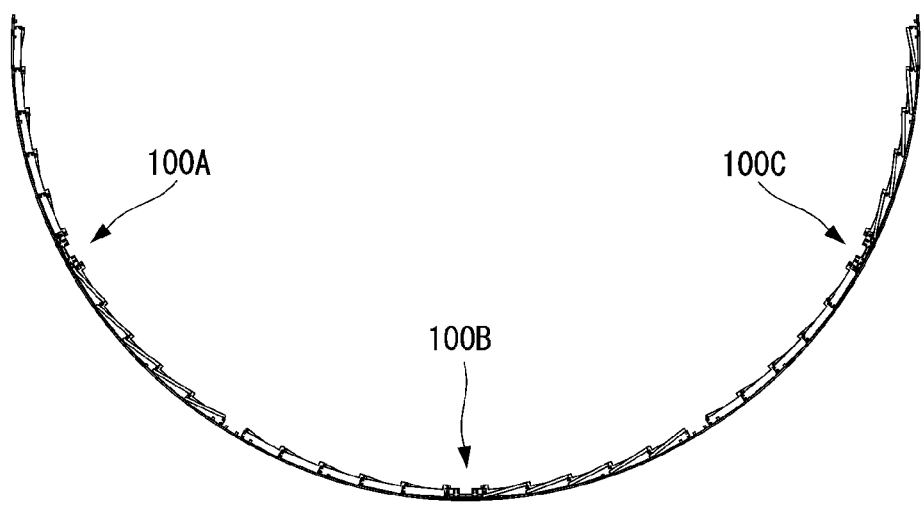
Figure 25:
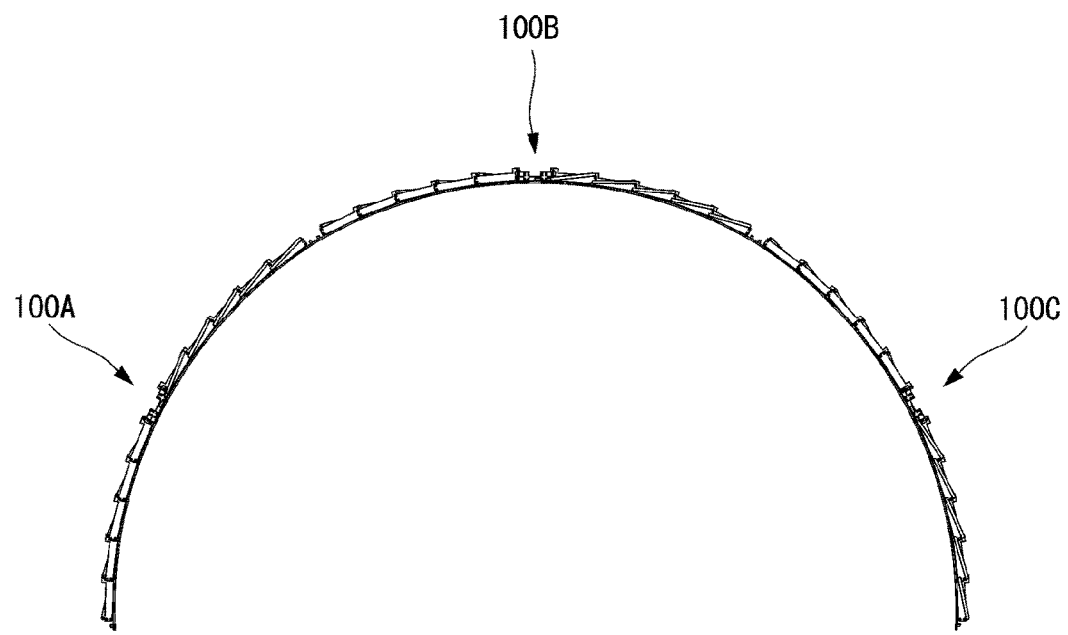

Referring to FIGS. 23 to 25, the multi-display devices 100a, 100b, and 100c may include a plurality of display devices.

For example, the multi-display devices 100a, 100b, and 100c may include a first display device 100a to a third display device 100c.

The first to third display devices 100a to 100c may be connected in series. The second display device 100b may be disposed between the first display device 100a and the third display device 100c.

The flexible jig of the first display device 100a can be hinged to the flexible jig of the second display device 100b. The flexible jig of the second display device 100b may be hinged to the flexible jig of the third display device 100c.

Referring to FIG. 23, the flexible jig of the first display device 100a and the flexible jig of the third display device 100c can be concavely curved toward forward, and the flexible jig of the two display device 100b can be convexly curved toward forward. For example, the multi-display devices 100a, 100b, and 100c may form a wave shape.

Referring to FIG. 24, the flexible jig of the first display device 100a to the flexible jig of the third display device 100c can be curved convexly toward the front. For example, the multi-display devices 100a, 100b, and 100c may form convex semicircular shape as a whole.

Referring to FIG. 25, the flexible jig of the first display device 100a to the flexible jig of the third display device 100c can be curved concavely toward the front. For example, the multi-display devices 100a, 100b, and 100c may form concave semicircular shape as a whole.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
a flexible display panel;
a flexible plate coupled to a rear of the flexible display panel; and
a flexible jig positioned at a rear of the flexible plate and comprising a plurality of segments,
wherein at least one of the plurality of segments is fixed to the rear of the flexible plate, and wherein at least another of the plurality of segments is slidably coupled to the rear of the flexible plate.

2. The display device of claim 1, wherein the flexible jig comprises:
a first flexible jig positioned adjacent to a first side of the flexible plate and configured in an elongated manner along the first side of the flexible plate; and
a second flexible jig positioned adjacent to a second side of the flexible plate and configured in an elongated manner along the second side of the flexible plate,
wherein the second side of the flexible plate is opposite the first side of the flexible plate.

3. The display device of claim 2, wherein the first flexible jig comprises:
a first segment positioned at a central portion of the first flexible jig;
a second segment positioned distal from the first segment;
a third segment positioned between the first and second segments; and
a fourth segment positioned between the first and third segments or between the second and third segments.

4. The display device of claim 3, wherein the first segment is fixed to the flexible plate, and wherein the second, third, and fourth segments are slidably coupled to the flexible plate.

5. The display device of claim 4, wherein each of the first, second, third, and fourth segments comprises:
an elongated upper board and an elongated lower board; and
a middle board disposed between the upper board and lower board,
wherein the middle board is shaped to comprise at least one inner hole.

6. The display device of claim 5, wherein the flexible plate comprises a plurality of bosses positioned at the rear of the flexible plate,
wherein the plurality of bosses comprises:
a first boss positioned in a left half of the rear of the flexible plate and configured to be inserted into a first inner hole of the first flexible jig; and
a second boss positioned in a right half of the rear of the flexible plate and configured to be inserted into a second inner hole of the first flexible jig.

7. The display device of claim 6, wherein:
the first inner hole is elongated along the longitudinal direction of the first flexible jig to allow the first boss to slidably travel along the first inner hole; and
the second inner hole is elongated along the longitudinal direction of the first flexible jig to allow the second boss to slidably travel along the second inner hole.

8. The display device of claim 7, wherein when the flexible display panel is changed to a concave display position:
the first boss slidably travels along the first inner hole in a first direction; and
the second boss slidably travels along the second inner hole in a second direction opposite the first direction.

9. The display device of claim 8, wherein when the flexible display panel is changed to a convex display position:
the second boss slidably travels along the second inner hole in the first direction; and
the first boss slidably travels along the first inner hole in the second direction.

10. The display device of claim 3, wherein a width of the fourth segment is less than a width of the third segment.

11. The display device of claim 1, further comprising a control gadget positioned at the rear surface of the flexible plate, wherein the flexible jig comprises an eleventh flexible jig portion and a twelfth flexible jig portion positioned on opposite sides of the control gadget.

12. The display device of claim 11, wherein each of the eleventh flexible jig portion and twelfth flexible jig portion comprises:
a first segment, wherein a side of the first segment is hingedly coupled to a side of the control gadget;
a second segment, wherein a side of the second segment is hingedly coupled to another side of the first segment;
a third segment, wherein a side of the third segment is hingedly coupled to another side of the second segment;
a first link coupling the side of the control gadget with the side of the second segment; and
a second link coupling the another side of the first segment with the side of the third segment.

13. The display device of claim 11, wherein the control gadget is fixed to the flexible plate, and
wherein the eleventh flexible jig portion and the twelfth jig portion are slidably coupled to the flexible plate.

14. The display device of claim 12, wherein each of the first, second, and third segments comprises:
an inner groove vertically positioned lengthwise along each segment; and
a bottom board positioned in the inner groove and shaped to comprise a bottom hole therethrough.

15. The display device of claim 14, wherein the flexible plate comprises a plurality of bosses positioned at the rear of the flexible plate,
wherein the plurality of bosses comprises:
a first boss positioned in a left half of the rear of the flexible plate and configured to be inserted into a first bottom hole of a first, second, or third segment of the eleventh flexible jig portion and
a second boss positioned in a right half of the rear of the flexible plate and configured to be inserted into a second bottom hole of a first, second, or third segment of the twelfth flexible jig portion.

16. The display device of claim 15, wherein the first bottom hole and the second bottom hole are elongated along a longitudinal direction of the flexible jig.

17. The display device of claim 16, wherein when the flexible display is changed to a concave display position:
the first boss slidably travels along the first bottom hole in a first direction; and
the second boss slidably travels along the second bottom hole in a second direction opposite the first direction.

18. The display device of claim 17, wherein when the flexible display panel is changed to a convex display position:
the second boss slidably travels along the second bottom hole in the first direction; and
the first boss slidably travels along the first bottom hole in the second direction.

19. The display device of claim 1, wherein:
a rear surface of the flexible display is attached to a center region of a front surface of the flexible plate by a vertically aligned elongated adhesive member; and
the flexible plate comprises coupling members disposed on opposite sides of the center region.

20. The display device of claim 19, wherein the coupling members are magnetic and configured to magnetically secure the display panel to permit sliding of regions of the display panel with respect to the flexible plate.

* * * * *